United States Patent
Naka

(10) Patent No.: US 8,091,048 B2
(45) Date of Patent: Jan. 3, 2012

(54) METHOD FOR PREDICTING RESIST PATTERN SHAPE, COMPUTER READABLE MEDIUM STORING PROGRAM FOR PREDICTING RESIST PATTERN SHAPE, AND COMPUTER FOR PREDICTING RESIST PATTERN SHAPE

(75) Inventor: Ryotaro Naka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 617 days.

(21) Appl. No.: 12/037,356

(22) Filed: Feb. 26, 2008

(65) Prior Publication Data
US 2008/0209386 A1      Aug. 28, 2008

(30) Foreign Application Priority Data
Feb. 27, 2007  (JP) ................. 2007-047885

(51) Int. Cl.
*G06F 17/50* (2006.01)
(52) U.S. Cl. ................ 716/51; 716/55; 716/56
(58) Field of Classification Search .............. 716/19–21, 716/51, 55, 56; 430/30
See application file for complete search history.

(56) References Cited

U.S. PATENT DOCUMENTS
6,643,616  B1  11/2003  Granik et al.
2006/0073686  A1 *  4/2006  Zach et al. ............... 438/551

FOREIGN PATENT DOCUMENTS
JP    2000-058417 A    2/2000
JP    2004-163472 A    6/2004
WO    2007/019269 A2    2/2007

OTHER PUBLICATIONS

Cobb et al., Mathematical and CAD Framework for Proximity Correction, Optical Microlithography, 1996, pp. 208-222, SPIE vol. 2726.
Cobb et al., Experimental Results on Optical Proximity Correction with Variable Threshold Resist Model, Optical Microlithography, 1997, pp. 458-468, SPIE vol. 3051.

* cited by examiner

*Primary Examiner* — Vuthe Siek
(74) *Attorney, Agent, or Firm* — Canon U.S.A., Inc. IP Division

(57) ABSTRACT

The contour shape of an aerial image formed on a resist by projecting a test pattern onto the resist via a projection optical system is computed. The shape of a resist pattern formed by the exposure using the test pattern and the development process is measured. A correction model indicating the relationship between the amount of characteristic of the contour shape and the amount of correction determined in accordance with the difference between the computed contour shape and the measured shape of the resist pattern is created. The contour shape of an aerial image formed on a resist by projecting an arbitrary pattern onto the resist via the projection optical system is computed. The shape of a resist pattern corresponding to the arbitrary pattern is predicted by correcting the computed contour shape of the aerial image, using the amount of correction given by the correction model in correspondence with the amount of characteristic of the contour shape.

10 Claims, 22 Drawing Sheets

F I G. 10
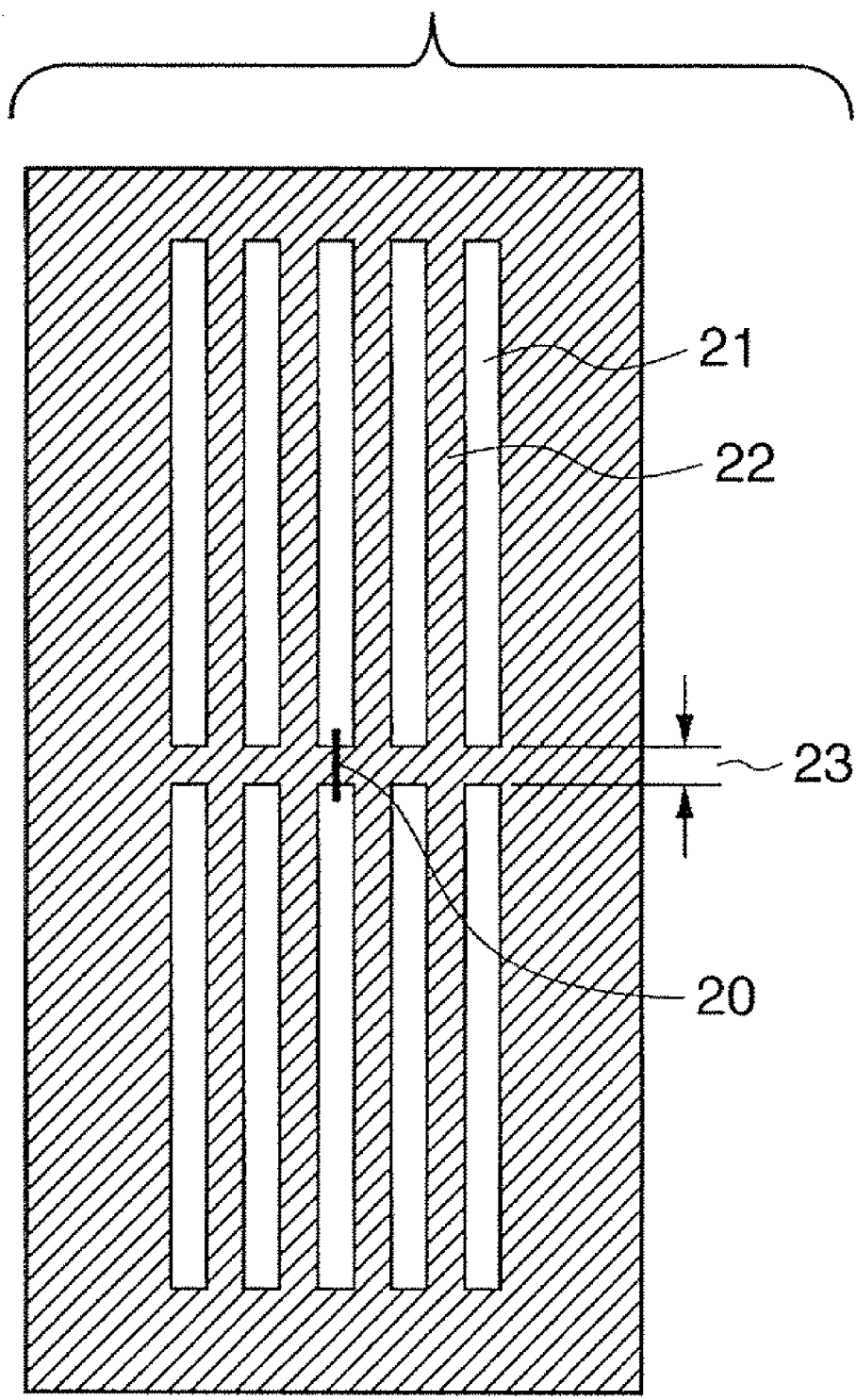

F I G. 20
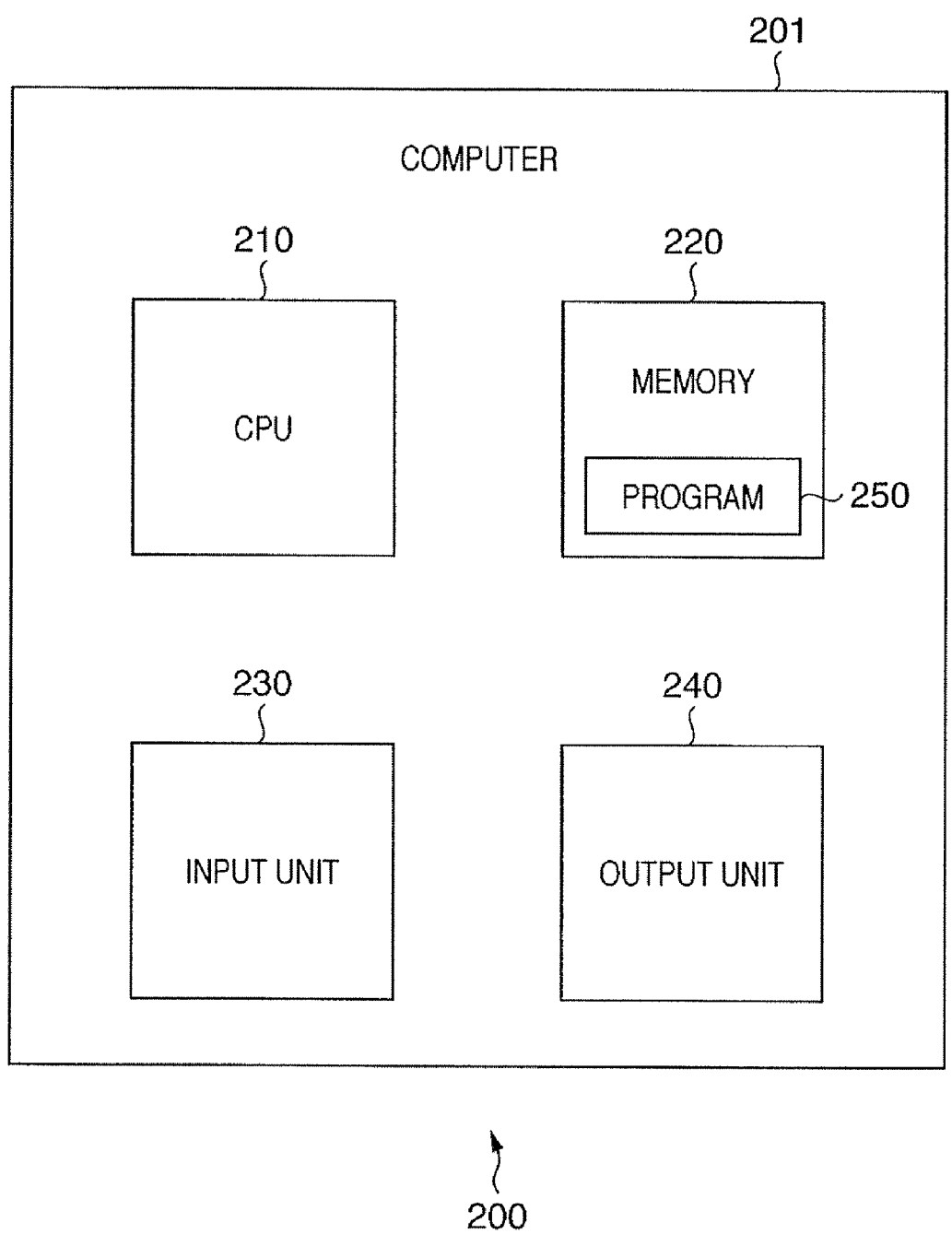

METHOD FOR PREDICTING RESIST PATTERN SHAPE, COMPUTER READABLE MEDIUM STORING PROGRAM FOR PREDICTING RESIST PATTERN SHAPE, AND COMPUTER FOR PREDICTING RESIST PATTERN SHAPE

BACKGROUND OF THE INVENTION

1. Field of the Invention

The present invention relates to the prediction of the shape of a resist pattern formed by exposing and developing a resist.

2. Description of the Related Art

In lithography, a projection exposure apparatus transfers a reticle pattern onto a resist (photosensitive agent) applied on a substrate (e.g., a semiconductor wafer or glass plate), and a developing device develops the resist, thereby obtaining a resist pattern. The resist pattern shape can be measured using an SEM (scanning electron microscope).

Along with dramatic increases in the degree of integration of elements of semiconductor devices, their minimum line widths (design rules) are increasingly becoming shorter. Under the circumstances, the resolution is enhanced by shortening the wavelength of exposure light and increasing the numerical aperture of a projection optical system.

Unfortunately, such approaches to increasing the resolution cannot meet the required minimum line widths. To combat this shortcoming, a pattern correction technique using optical proximity effect is employed.

The pattern correction must be executed for the entire reticle pattern. For this reason, a reticle pattern correction operation takes a very long time.

Patent reference 1 and non-patent references 1 and 2 disclose methods of predicting the resist pattern shape by computing an aerial image, that is, light intensity distribution formed on a resist using a reticle pattern, and by determining the optical contour shape at an arbitrary light intensity level as the resist pattern shape. The computation accuracies of these prediction methods are relatively low due to approximation errors upon creating computation model equations.

Patent reference 2 computes the light intensity distribution of an aerial image formed on a resist using a reticle pattern. Based on the resultant light intensity distribution, an exponential decay function of two parameters, that is, a process factor and an edge light intensity shift is obtained. The convolution integral of the light intensity distribution and the exponential decay function is calculated, thereby computing the resist pattern shape. This method takes a long time to calculate the convolution integral.

[Patent Reference 1] U.S. Pat. No. 6,643,616

[Patent Reference 2] Japanese Patent Laid-Open No. 2000-58417

[Non-patent Reference 1] Mathematical and CAD Framework for Proximity Correction (1996 SPIE Vol. 2726 P 208-222, Optical Microlithography)

[Non-patent Reference 2] Experimental Results on Optical Proximity Correction with Variable Threshold Resist Model (1997 SPIE Vol. 3051 P 458-468, Optical Microlithography)

SUMMARY OF THE INVENTION

The present invention has been made in consideration of the above-described situation, and has as its object to, for example, provide a novel technique of predicting the shape of a resist pattern formed by exposing and developing a resist.

According to the first aspect of the present invention, there is provided a method of predicting a shape of a resist pattern formed by an exposure process of projecting light from a reticle pattern onto a resist via a projection optical system to expose the resist, and a development process of developing the resist, the method comprising a first computation step of computing a contour shape of an aerial image formed on the resist by projecting light from a test pattern serving as the reticle pattern onto the resist via the projection optical system, a measurement step of measuring a shape of a resist pattern formed by the exposure process using the test pattern and the development process, a creation step of creating a correction model indicating a relationship between an amount of characteristic of the contour shape and an amount of correction determined in accordance with a difference between the contour shape computed in the first computation step and the shape of the resist pattern measured in the measurement step, a second computation step of computing a contour shape of an aerial image formed on the resist by projecting light from an arbitrary pattern serving as the reticle pattern onto the resist via the projection optical system, and a prediction step of predicting a shape of a resist pattern corresponding to the arbitrary pattern by correcting the contour shape of the aerial image computed in the second computation step, using an amount of correction given by the correction model in correspondence with the amount of characteristic of the contour shape.

According to the second aspect of the present invention, there is provided a method of predicting a shape of a resist pattern formed by an exposure process of projecting light from a reticle pattern onto a resist via a projection optical system to expose the resist, and a development process of developing the resist, the method comprising a first computation step of computing a contour shape of an aerial image formed on the resist by projecting light from a test pattern serving as the reticle pattern onto the resist via the projection optical system, an acquisition step of acquiring a result of measuring a shape of a resist pattern formed by the exposure process using the test pattern and the development process, a creation step of creating a correction model indicating a relationship between an amount of characteristic of the contour shape and an amount of correction determined in accordance with a difference between the contour shape computed in the first computation step and the shape of the resist pattern acquired in the acquisition step, a second computation step of computing a contour shape of an aerial image formed on the resist by projecting light from an arbitrary pattern serving as the reticle pattern onto the resist via the projection optical system; and a prediction step of predicting a shape of a resist pattern corresponding to the arbitrary pattern by correcting the contour shape of the aerial image computed in the second computation step, using an amount of correction given by the correction model in correspondence with the amount of characteristic of the contour shape.

According to the third aspect of the present invention, there is provided a computer readable medium storing a program for causing a computer to execute a process of predicting a shape of a resist pattern formed by an exposure process of projecting light from a reticle pattern onto a resist via a projection optical system to expose the resist, and a development process of developing the resist, the program causing the computer to execute a first computation step of computing a contour shape of an aerial image formed on the resist by projecting light from a test pattern serving as the reticle pattern onto the resist via the projection optical system, an acquisition step of acquiring a result of measuring a shape of a resist pattern formed by the exposure process using the test pattern and the development process, a creation step of creating a correction model indicating a relationship between an amount of characteristic of the contour shape and an amount of correction determined in accordance with a difference between the contour shape computed in the first computation step and the shape of the resist pattern acquired in the acquisition step;

a second computation step of computing a contour shape of an aerial image formed on the resist by projecting light from an arbitrary pattern serving as the reticle pattern onto the resist via the projection optical system, and a prediction step of predicting a shape of a resist pattern corresponding to the arbitrary pattern by correcting the contour shape of the aerial image computed in the second computation step, using an amount of correction given by the correction model in correspondence with the amount of characteristic of the contour shape.

According to the fourth aspect of the present invention, there is provided a computer which predicts a shape of a resist pattern formed by an exposure process of projecting light from a reticle pattern onto a resist via a projection optical system to expose the resist, and a development process of developing the resist, the computer comprising a first computation unit configured to compute a contour shape of an aerial image formed on the resist by projecting light from a test pattern serving as the reticle pattern onto the resist via the projection optical system, an acquisition unit configured to acquire a result of measuring a shape of a resist pattern formed by the exposure process using the test pattern and the development process, a creation unit configured to create a correction model indicating a relationship between an amount of characteristic of the contour shape and an amount of correction determined in accordance with a difference between the contour shape computed by the first computation unit and the shape of the resist pattern acquired by the acquisition unit, a second computation unit configured to compute a contour shape of an aerial image formed on the resist by projecting light from an arbitrary pattern serving as the reticle pattern onto the resist via the projection optical system, and a prediction unit configured to predict a shape of a resist pattern corresponding to the arbitrary pattern by correcting the contour shape of the aerial image computed by the second computation unit, using an amount of correction given by the correction model in correspondence with the amount of characteristic of the contour shape.

According to the present invention, it is possible to, for example, provide a novel technique of predicting the shape of a resist pattern formed by exposing and developing a resist.

Further features of the present invention will become apparent from the following description of exemplary embodiments with reference to the attached drawings.

BRIEF DESCRIPTION OF THE DRAWINGS

FIG. 10 is a view showing an example of test pattern C for creating the correction model;

FIG. 20 is a block diagram showing a configuration of a resist simulator;

DESCRIPTION OF THE EMBODIMENTS

First Embodiment

The present invention relates to, for example, a method of predicting the shape of a resist pattern formed by an exposure process of projecting a reticle pattern onto a resist via a projection optical system of a projection exposure apparatus to expose the resist, and a development process of developing the resist in lithography. The reticle pattern means a pattern formed on a reticle. The reticle means an original and is also often called a mask. The reticle pattern can include, for example, the patterns of a plurality of elements of a device such as a semiconductor device, liquid crystal display device, or thin-film magnetic head.

Figure 17:
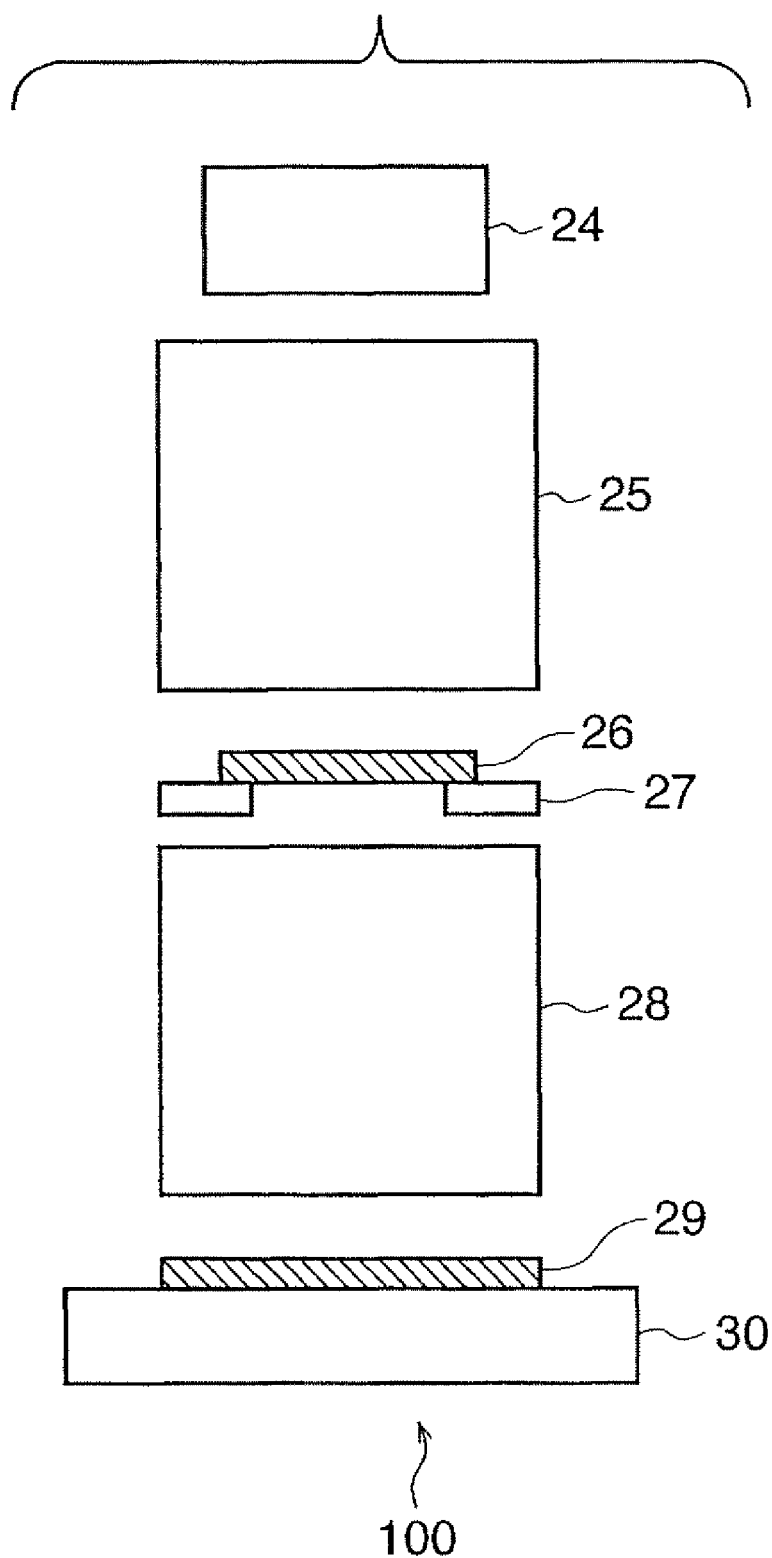
FIG. 17 is a view showing an arrangement of a projection exposure apparatus.

FIG. 17 is a view showing an arrangement of a projection exposure apparatus used in lithography. A projection exposure apparatus 100 comprises a light source (e.g., a laser) 24, illumination optical system 25, reticle stage 27, projection optical system 28, and substrate stage 30.

A reticle 26 on which a reticle pattern is formed is held and aligned by the reticle stage 27. A substrate (e.g., a wafer or glass plate) 29 coated with a resist as a photosensitive agent is held and aligned by the substrate stage 30. Light from the reticle 26 illuminated by the illumination optical system 25 is projected onto the resist on the substrate 29 via the projection optical system 28 to form an aerial image (optical image) on the resist. The resist is exposed via this aerial image, thereby forming a latent image pattern on it. When a developing device develops the resist, the latent image pattern is patterned into a resist pattern. The shape of an aerial image or latent image pattern is generally different from that of a resist pattern formed by the development process. An SEM can measure the resist pattern shape.

Figure 1:
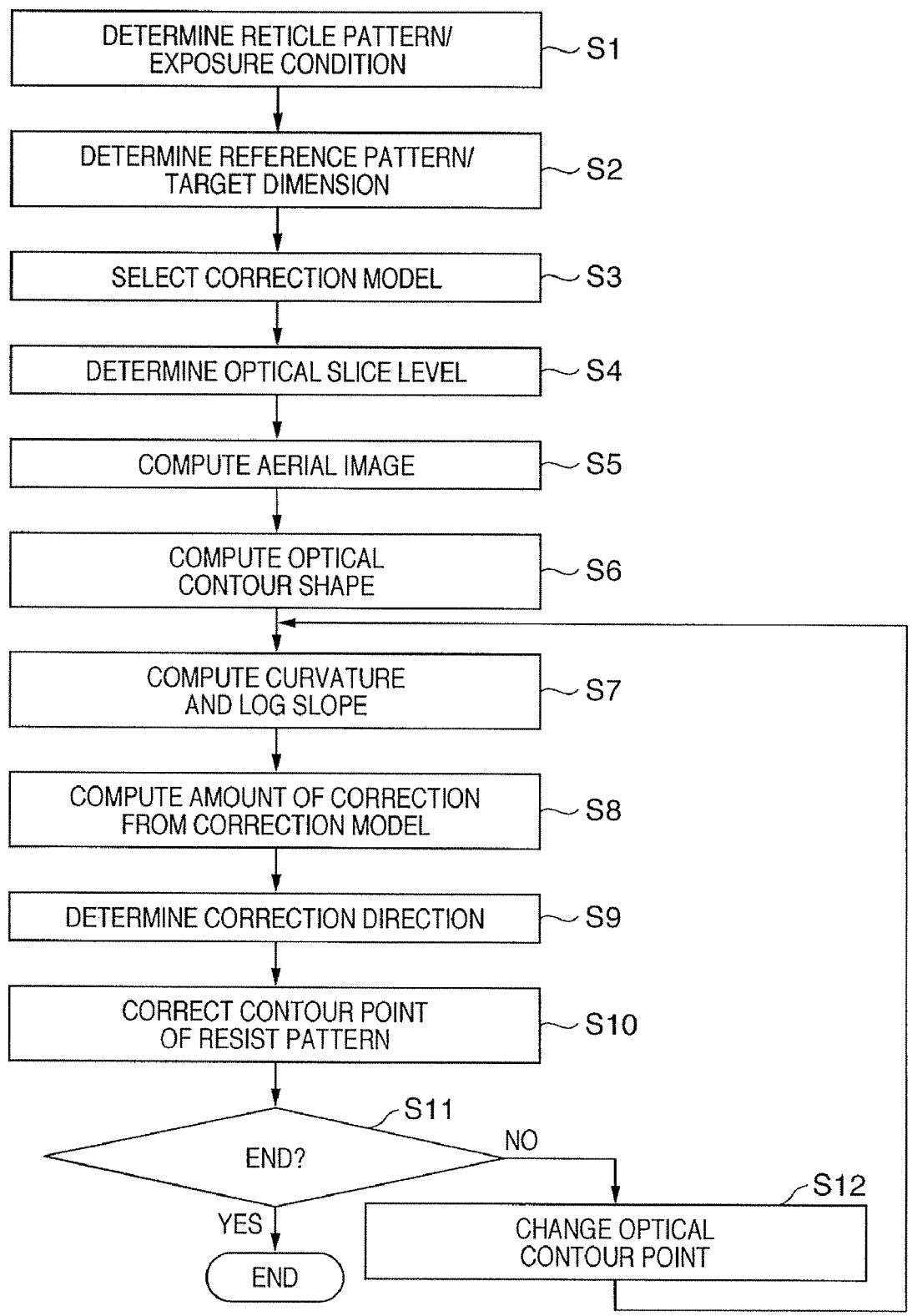
FIG. 1 is a flowchart illustrating the sequence of a resist pattern shape prediction method according to a preferred embodiment of the present invention.
Figure 2:
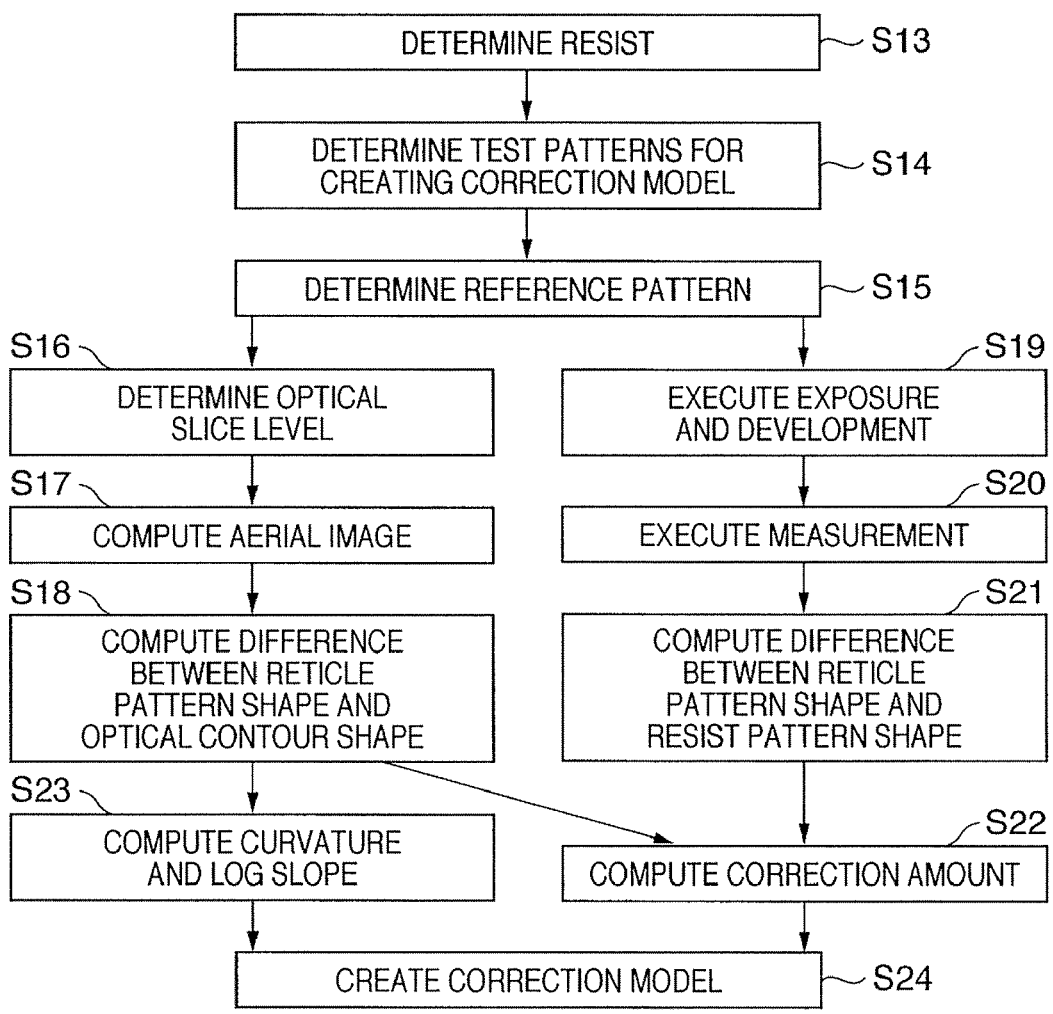
FIG. 2 is a flowchart illustrating the sequence of a correction model creation method.

FIG. 1 is a flowchart illustrating the sequence of a resist pattern shape prediction method according to a preferred embodiment of the present invention. FIG. 2 is a flowchart illustrating the sequence of a method of creating a correction model selected in step S3 of FIG. 1. A resist simulator can execute the processes shown in FIG. 1, and the processes shown in FIG. 2 except for steps S19 and S20.

FIG. 20 is a block diagram showing a configuration of a resist simulator. A resist simulator 200 shown in FIG. 20 can be constituted by installing a program 250 in a computer 201. The computer 201 includes, for example, a CPU 210, a memory (e.g., a DRAM or hard disk) 220, an input unit (e.g., a keyboard, communication interface, or media reader) 230, and an output unit (e.g., a display, memory, or communication interface) 240. For example, the program 250 can be loaded into the computer 201 via the input unit 230 and written in the memory 220 in a predetermined format. For example, the resist simulator 200 or computer 201 can be a constituent component of the projection exposure apparatus 100 as illustrated in FIG. 17. The overall portion or a part of the portion, other than the computer 201, of the projection exposure apparatus 100 is defined as a main body part, which connects to the computer 201.

Figure 5:
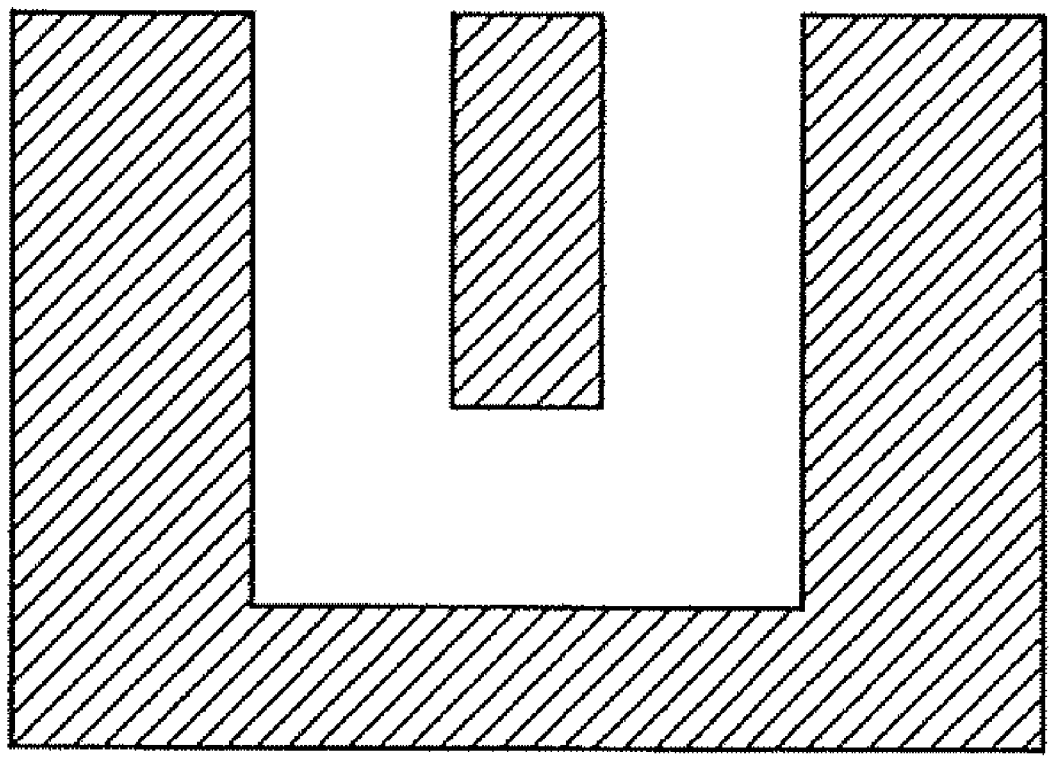
FIG. 5 is a view illustrating a partial reticle pattern.

The resist pattern shape prediction method shown in FIG. 1 will be explained. In step S1, an arbitrary reticle pattern and exposure condition are determined. This determination is typically done by inputting a reticle pattern and exposure condition to the resist simulator 200 via the input unit 230. FIG. 5 is a view illustrating a partial reticle pattern.

Figure 3:
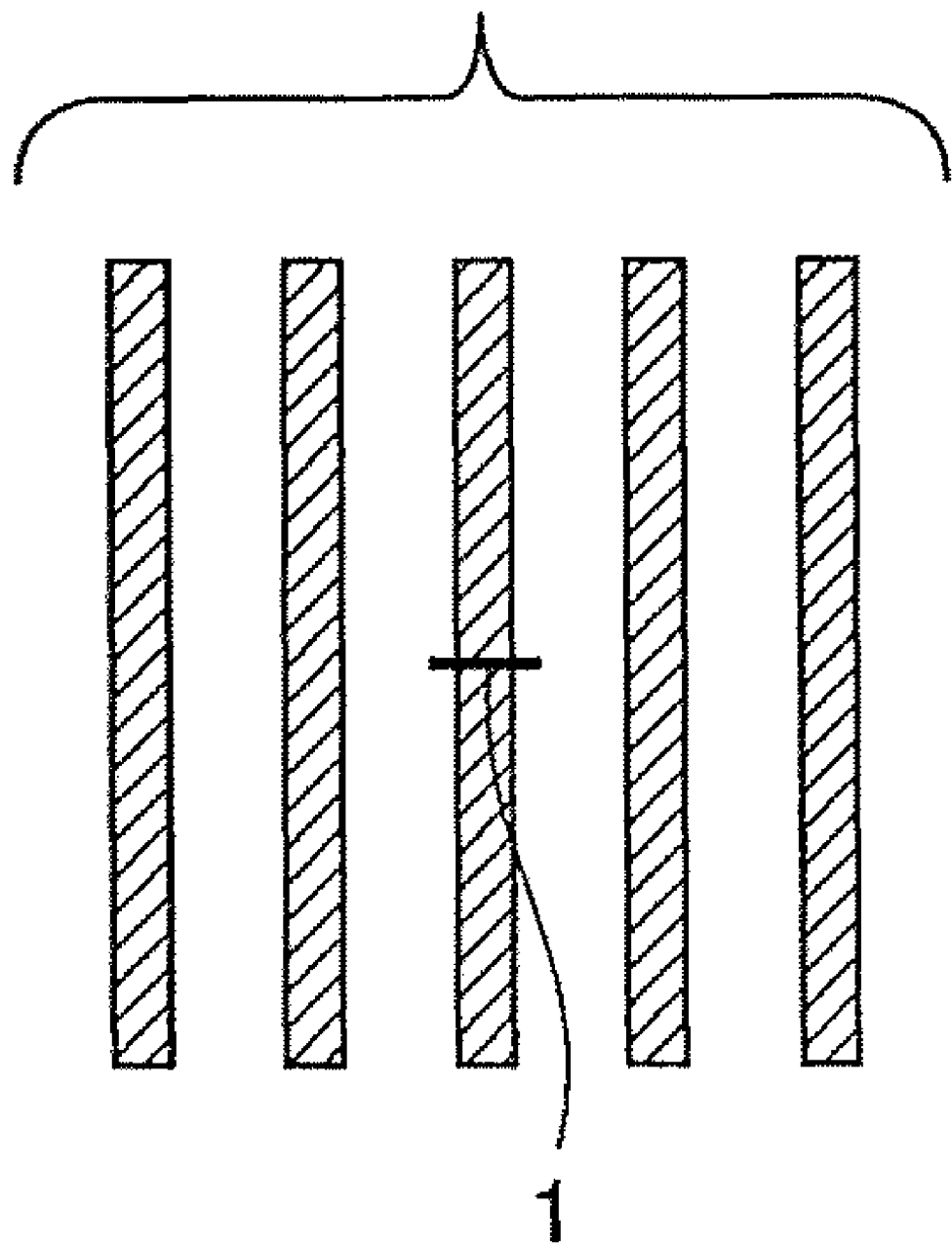
FIG. 3 is a view showing an example of a reference pattern.

In step S2, a reference pattern and its target dimension and evaluation position are determined. This determination is typically done by inputting a reference pattern and its target dimension and evaluation position to the resist simulator 200 via the input unit 230. The reference pattern here means a pattern serving as a criterion used in determining the amount of exposure of the reticle pattern. FIG. 3 illustrates an example of the reference pattern. Referring to FIG. 3, a position 1 is an example of the evaluation position.

In step S3, one of a plurality of correction models is selected in accordance with a resist (photosensitive agent) as the resist pattern shape prediction target. The plurality of correction models as the selection candidates are formed by the processes shown in FIG. 2.

Figure 4:
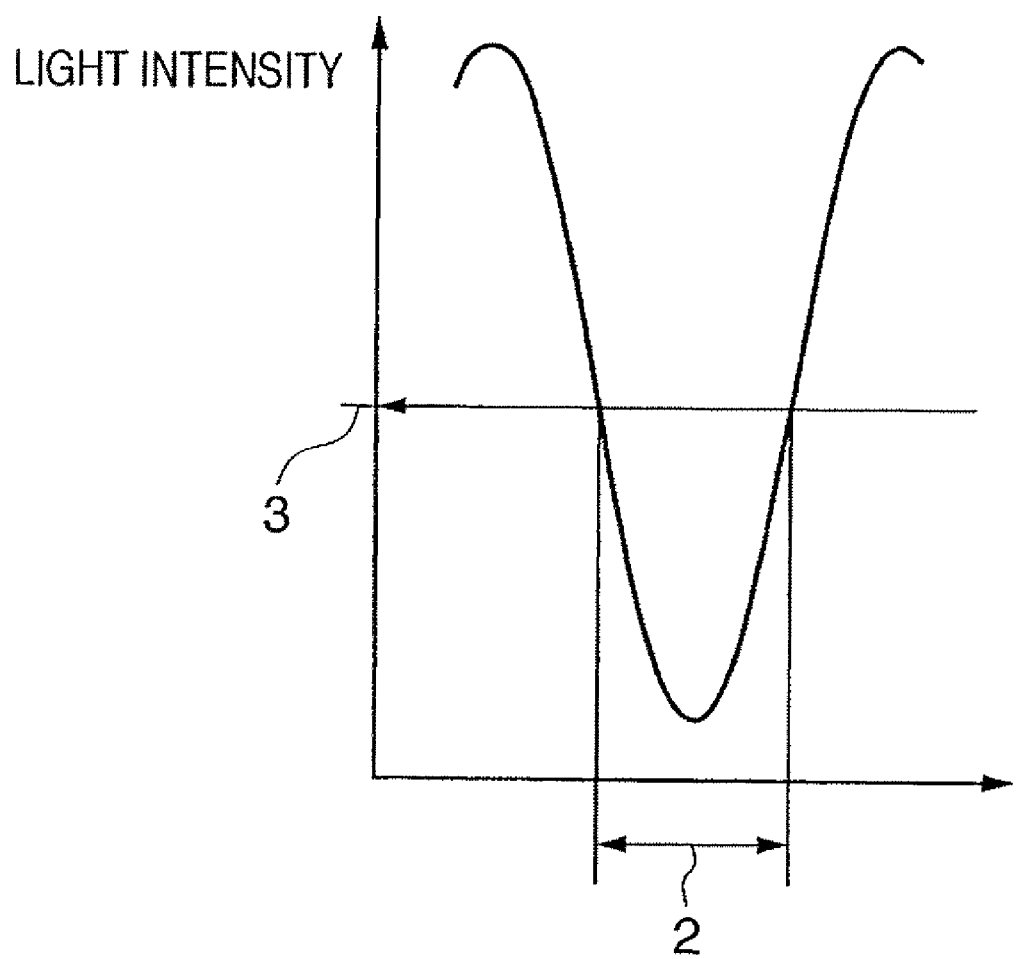
FIG. 4 is a graph for explaining an optical slice level determination method.

In step S4, an aerial image (an image formed on the image plane of the projection optical system) of the reference pattern determined in step S2 is computed to determine an optical slice level for achieving the target dimension of the reference pattern at its evaluation position. FIG. 4 is a graph for explaining an optical slice level determination method, and shows the light intensity distribution of an aerial image at the evaluation position 1 determined in step S2. Referring to FIG. 4, reference numeral "2" indicates the target dimension input in step S2; and "3", the optical slice level at which the target dimension 2 is obtained.

In step S5, an aerial image, that is, light intensity distribution formed on the image plane (i.e., the substrate surface) of the projection optical system 28 when the reticle pattern (e.g., the one shown in FIG. 5) determined in step S1 is used is computed. Various known methods can be adopted to compute an aerial image formed on the image plane of the projection optical system. For example, an aerial image, that is, the light intensity distribution formed on the image plane of the projection optical system can be computed when a reticle pattern is given as information on the object plane of the projection optical system and the illumination condition of the reticle pattern is given.

Figure 6:
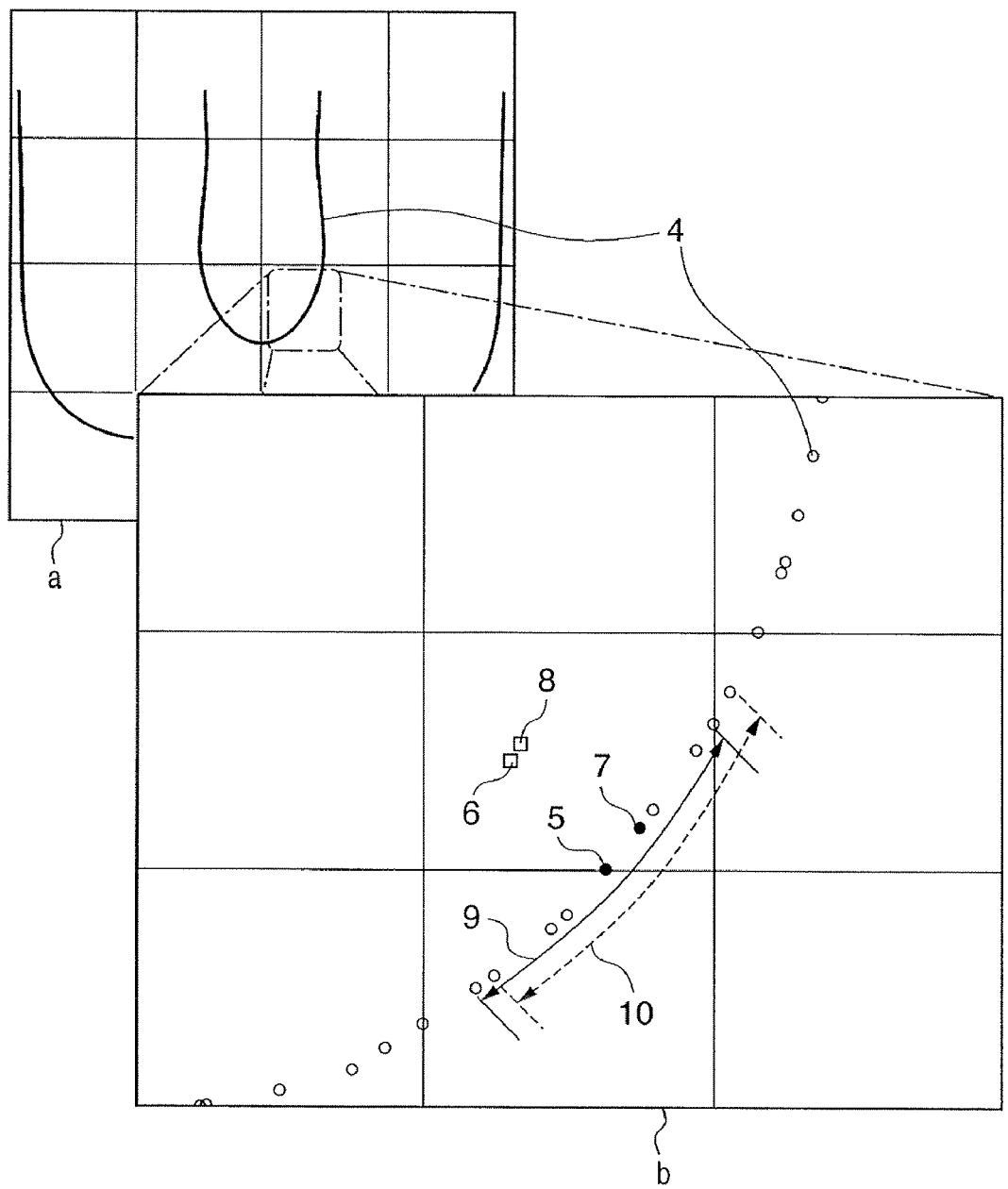
FIG. 6 is a view illustrating the optical contour shape of an aerial image formed on the image plane of a projection optical system.

In step S6 (second computation process), the contour shape (to be referred to as an optical contour shape hereinafter) of the section of the light intensity distribution, which is computed in step S5, when cut away parallel to the substrate surface at the optical slice level determined in step S4 is computed. FIG. 6 is a view illustrating an optical contour shape obtained by using the reticle pattern shown in FIG. 5. "a" shows an optical contour shape corresponding to the overall reticle pattern shown in FIG. 5. "b" shows a partial enlarged view of "a". Reference numeral "4" indicates the optical contour shape.

In step S7 (part of a correction process), the curvature and log slope at each optical contour point which forms the optical contour shape are computed as the amounts of characteristic indicating the characteristics of the optical contour shape. A computation example of the amounts of characteristic indicating the characteristics of the optical contour shape will be explained with reference to FIG. 6. Consider a minute region 9 along the optical contour shape 4, which has an optical contour point 5 as its center. The optical contour points in the minute region 9 are assumed to match the circumference of an approximate circle. The reciprocal of the radius of curvature of the circle at the optical contour point 5 is defined as the curvature. Although a circle will be exemplified as the optical contour shape, it may be the curvature of an elliptic function or other functions such as a polynomial, which can yield a second derivative. The first derivative of the logarithm of the light intensity distribution on a line which connects the optical contour point 5 and the central point of the circle with respect to the coordinate position on the line is defined as the log slope. The direction of the log slope can be the direction of the normal to a tangent to the optical contour shape or the normal to a tangential plane to the light intensity distribution. In the same way, the curvature and log slope of the optical contour shape at an optical contour point 7 as the center of a minute region 10 can be computed.

In step S8 (another part of the correction process), the amount of correction determined by a correction model in accordance with the computed curvature and log slope is computed. The amount of correction can be either positive or negative.

In step S9 (still another part of the correction process), the correction direction is determined based on the normal vector at the center of the minute region. This normal vector may be obtained from a tangent to the optical contour shape or from a tangential plane to the computed light intensity distribution.

For example, a resist pattern shape computation model for determining the resist pattern shape can be defined by:

(the position of a contour point of a resist pattern)=
(the position of an optical contour point)+(the
amount of correction of the resist pattern)

In step S10 (prediction process), the optical contour point moves along the computed correction direction by the amount of correction computed in step S8. One contour point of the resist pattern corresponding to the center of a minute region which forms the optical contour shape is determined. That is, a contour point of the resist pattern is determined by correcting the optical contour point. For example, a contour point 6 of the resist pattern corresponding to the optical contour point 5 shown in FIG. 6 is determined.

In step S11, it is determined whether all of a plurality of optical contour points which form the optical contour shape are processed. If an unprocessed optical contour point remains, the processing target is changed to the unprocessed optical contour point and the process returns to step S7.

Figure 7:
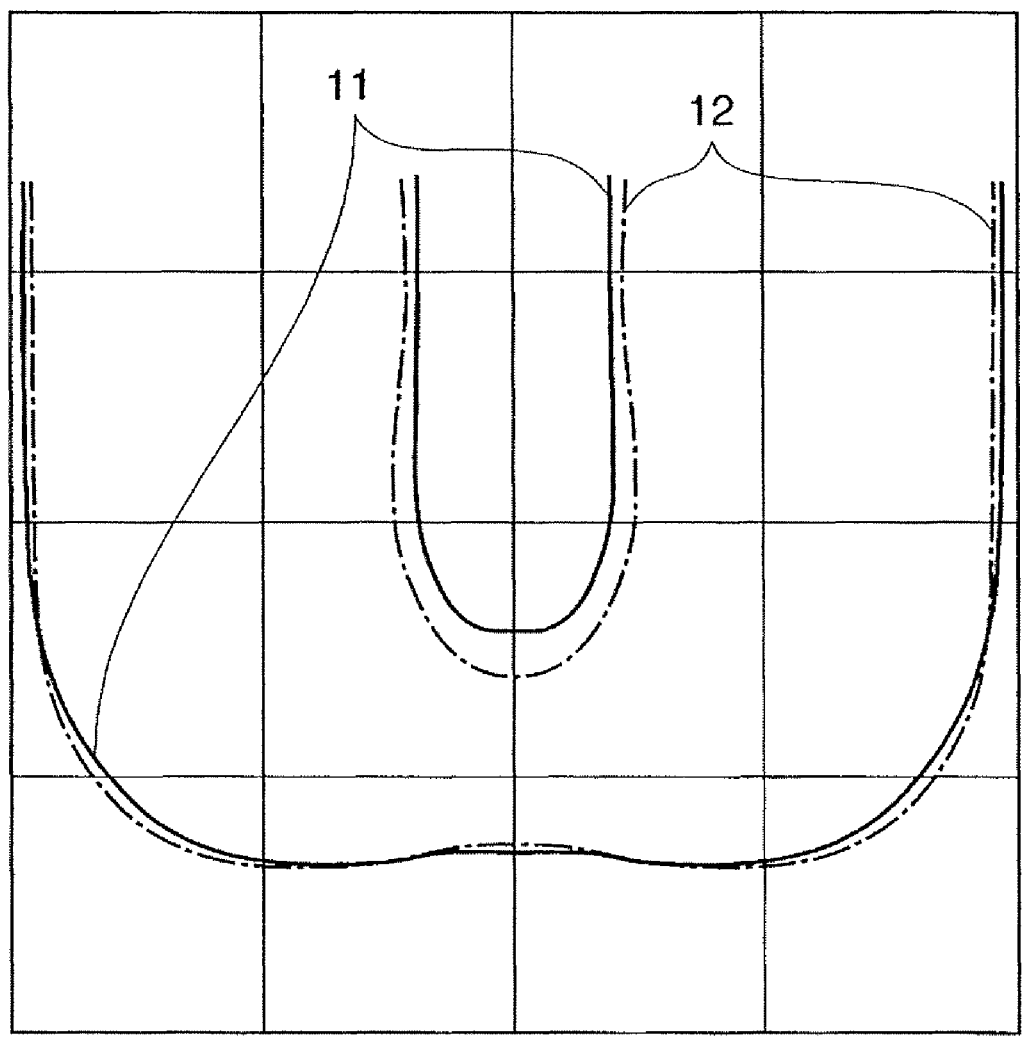
FIG. 7 is a view illustrating the difference between the optical contour shape and the resist pattern shape.

With the above-described processes, a resist pattern shape corresponding to the reticle pattern determined in step S1 is determined. FIG. 7 illustrates an optical contour shape 12 determined in step S6 and a resist pattern shape 11 determined by repeating steps S7 to S11.

The curvature and log slope are exemplified as the amounts of characteristic (parameters) obtained from the light intensity distribution here. For example, however, a resist pattern may be determined based on the other amounts of characteristic (parameters) such as the derivative of a polynomial, which are obtained from the light intensity distribution.

The resist pattern shape prediction method as described above shortens the computation time by predicting the resist pattern shape using a simple method of adding the amount of correction to the position of an optical contour point.

Correction model creation shown in FIG. 2 will be explained. In step S13, a resist as the correction model creation target is determined. This determination is typically done by inputting the type, identification information, or characteristic information of a resist to the resist simulator 200 via the input unit 230.

In step S14, a plurality of test patterns for creating correction models are determined. In addition, an exposure condition and a plurality of evaluation positions for the respective test patterns are determined. This determination is typically done by inputting an exposure condition and evaluation positions to the resist simulator 200 via the input unit 230.

Figure 8:
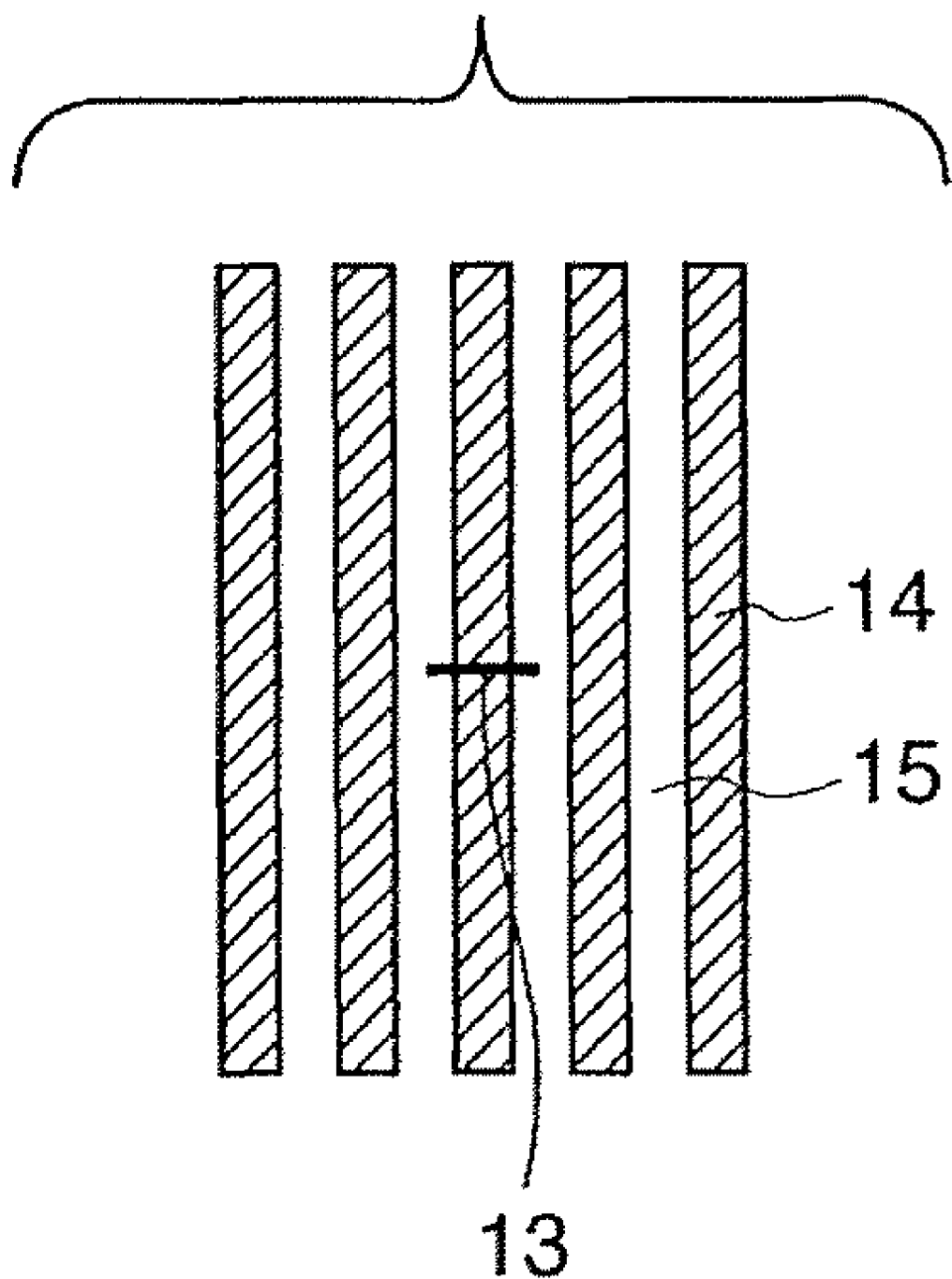
FIG. 8 is a view showing an example of test pattern A for creating a correction model.
Figure 9:
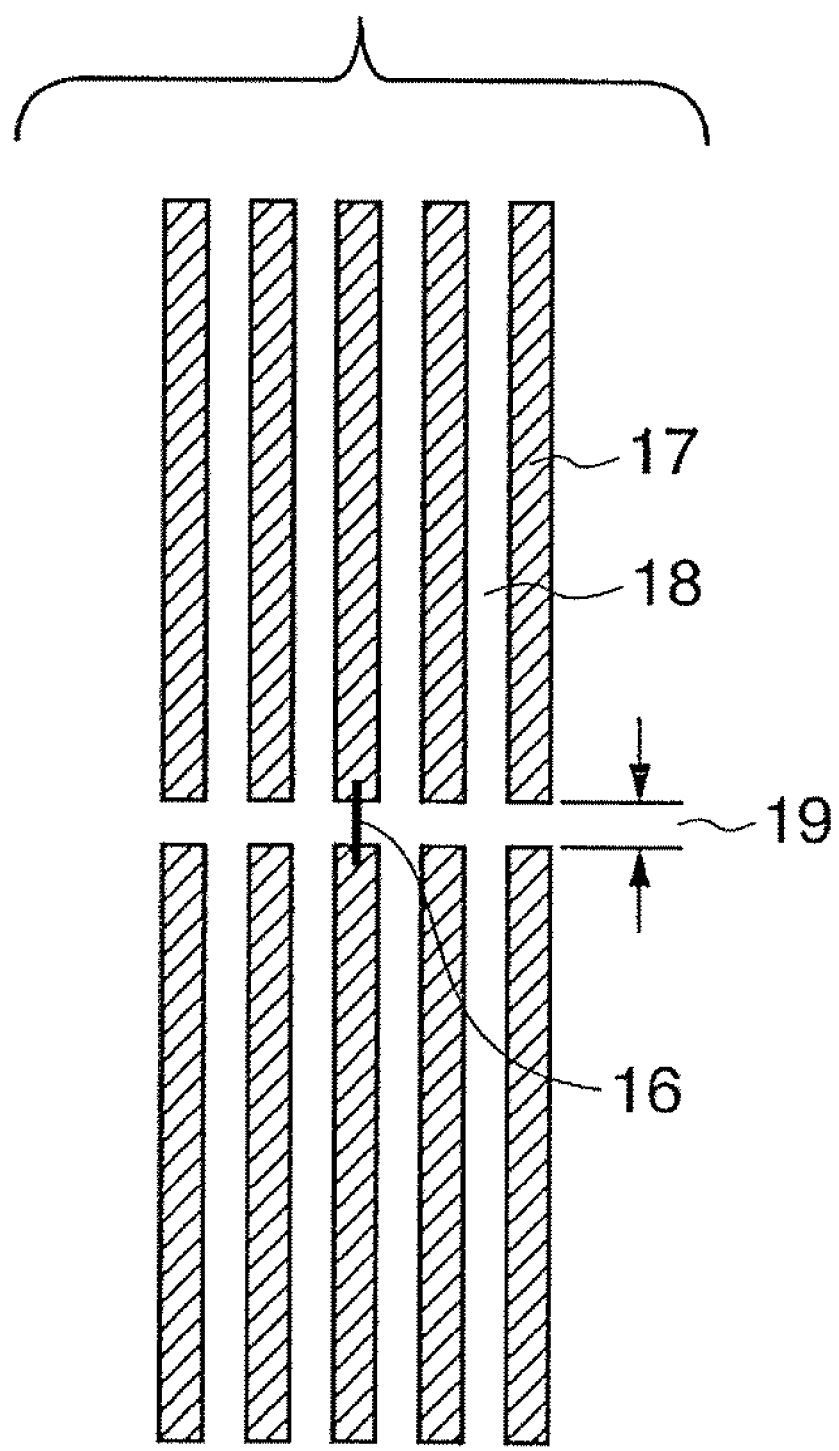
FIG. 9 is a view showing an example of test pattern B for creating the correction model.

FIGS. 8, 9, and 10 illustrate test patterns A, B, and C. The test patterns, exposure condition, and evaluation positions are determined so as to obtain evaluation results for various lines, spaces, and gaps. Test patterns, lines, spaces, and gaps are evaluated as much as possible, and the evaluation result is reflected in a correction model, thereby improving the prediction accuracy.

In step S15, a reference pattern and its target dimension and evaluation position are determined. FIG. 3 illustrates an example of the reference pattern. To increase the degree of freedom to select a test pattern and its target dimension and evaluation position, it is necessary to evaluate reference patterns and their target dimensions and evaluation positions as much as possible and reflect the evaluation result in a correction model.

In step S16, an aerial image of the reference pattern determined in step S15 is computed to determine an optical slice level for achieving the target dimension of the reference pattern at its evaluation position. A detailed example of this process is the same process as in step S4.

In step S17 (part of a first computation process), an aerial image, that is, light intensity distribution formed on the image plane of the projection optical system when a reticle according to the test patterns determined in step S14 is used is computed.

In step S18, the difference between the reticle pattern and the optical contour shape is computed. More specifically, the optical contour shape of the section of the light intensity distribution, which is computed in step S17, when cut away parallel to the substrate surface at the optical slice level determined in step S16 is computed (first computation process). At the evaluation position of each test pattern, which is determined in step S14, the difference between the shape of a reticle pattern according to each test pattern and the optical contour shape of an aerial image formed on the image plane of the projection optical system 28 using the reticle pattern according to each test pattern is computed. FIGS. 8, 9, and 10 illustrate evaluation positions at each of which this difference is computed. The test pattern illustrated in FIG. 8 includes lines 14 and spaces 15, and the difference for them can be computed at, for example, an evaluation position 13. The test pattern illustrated in FIG. 9 includes lines 17, spaces 18, and a gap (the gap between the lines) 19, and the difference for them can be computed at, for example, an evaluation position 16. The test pattern illustrated in FIG. 10 includes lines 22, spaces 21, and a gap (the gap between the spaces) 23, and the difference for them can be computed at, for example, an evaluation position 20.

In step S23, the curvature and log slope are computed as the amounts of characteristic indicating the characteristics of a test pattern at an evaluation position included in a minute region serving as a reference region. The amounts of characteristic are computed at each of a plurality of evaluation positions. The amounts of characteristic are not particularly limited to the curvature and log slope, and may be other parameters.

The processes in steps S19 to S21 are executed independently of the processes in steps S16 to S23.

In step S19, the exposure apparatus exposes a substrate using a reticle including the reference pattern and the plurality of test patterns. The exposed substrate is then developed. With this operation, a resist pattern is formed on the substrate. The amount of exposure is determined in accordance with the target dimension of the reference pattern.

In step S20 (measurement process and acquisition process), the shape of the formed resist pattern is measured. The resist simulator 200 acquires the measurement result via the input unit 230. This measurement can be done using, for example, an SEM. FIGS. 8, 9, and 10 illustrate measurement evaluation positions. The test pattern illustrated in FIG. 8 includes the lines 14 and spaces 15, and measurement can be done at, for example, the evaluation position 13. The test pattern illustrated in FIG. 9 includes the lines 17, spaces 18, and gap (the gap between the lines) 19, and measurement can be done at, for example, the evaluation position 16. The test pattern illustrated in FIG. 10 includes the lines 22, spaces 21, and gap (the gap between the spaces) 23, and measurement can be done at, for example, the evaluation position 20.

In step S21, at the evaluation position of each test pattern, the difference between the shape of a reticle pattern according to each test pattern and that of a resist pattern formed by it is computed based on the measurement result obtained in step S20.

In step S22, at the evaluation position of each test pattern, the difference between the optical contour shape and the resist pattern shape is computed based on the computation results obtained in steps S18 and S21. This difference is the amount of correction of the resist pattern. In this embodiment, the difference between the optical contour shape and the resist pattern shape is computed based on the difference between the reticle pattern shape and the optical contour shape obtained in step S18, and that between the reticle pattern shape and the resist pattern shape obtained in step S21. This embodiment has exemplified a case in which the difference between the optical contour shape and the resist pattern shape is obtained via the reticle pattern. However, the symmetry of a test pattern, for example, may be used. That is, the optical contour shape may be computed and the resist pattern shape may be measured for the line width and the width between the edges of opposing lines, thereby determining a half of their difference as the amount of correction. In this way, the difference between the optical contour shape and the resist pattern shape may be directly computed.

In step S24, a correction model is generated by approximating the relationship between the amounts of characteristic (curvature and log slope) and the amount of correction using a plane function based on the computation results obtained in steps S22 and S23.

This correction model is defined by:

$$Z = aX + bY + c$$

where Z is the variable of the amount of correction, X is the variable of the curvature, Y is the variable of the log slope, and a, b, and c are coefficients.

This correction model is given by the linear function of the curvature X at each contour point of the contour shape and the log slope Y of an aerial image at each contour point.

Figure 11:
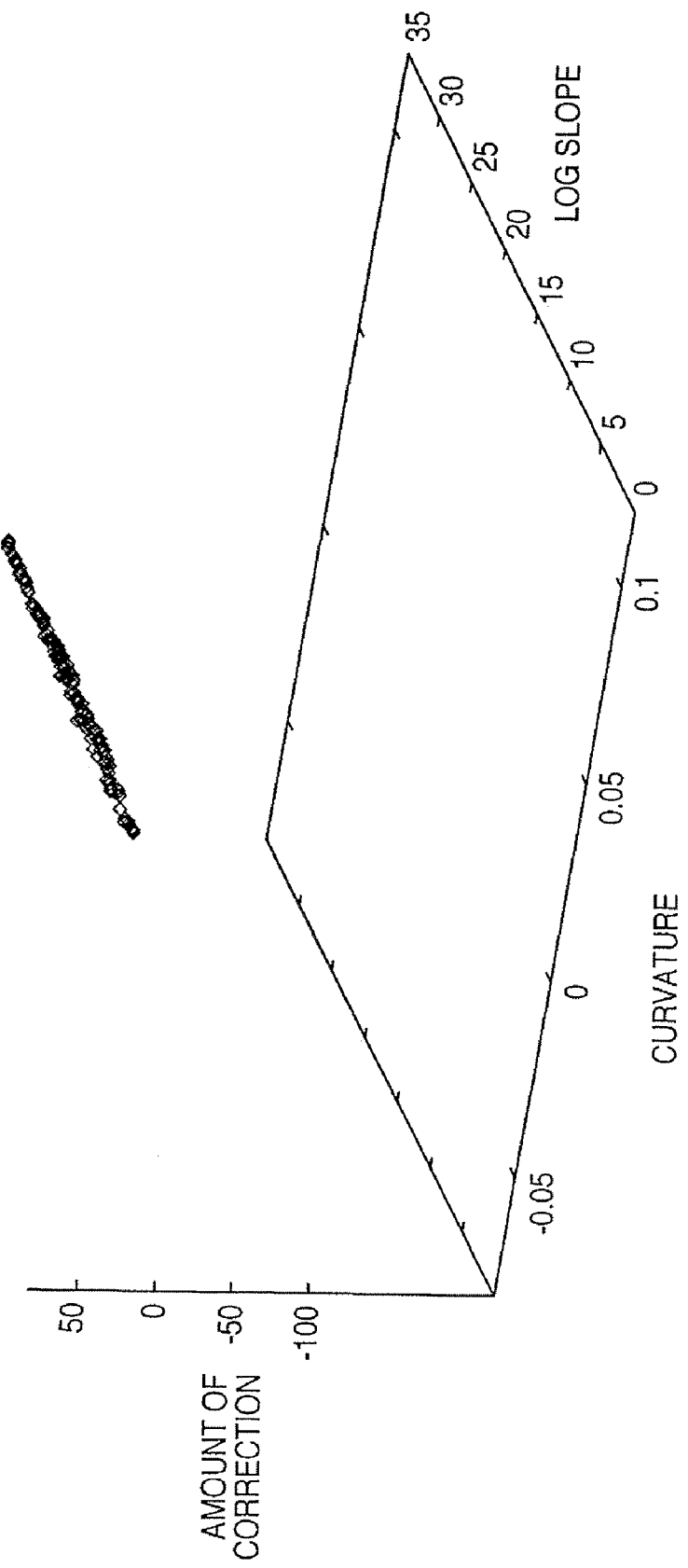
FIG. 11 is a graph showing plots of the amount of correction with respect to the curvature and log slope evaluated using test pattern A.
Figure 12:
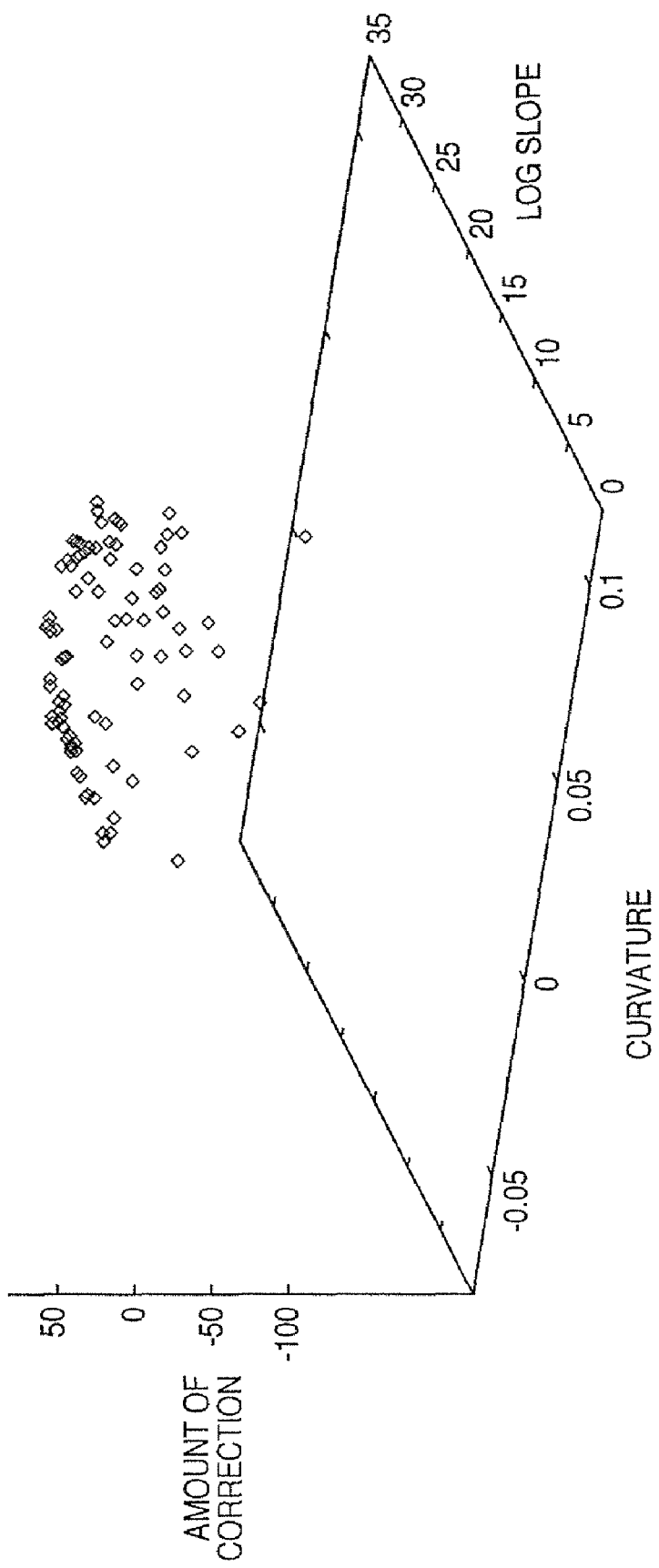
FIG. 12 is a graph showing plots of the amount of correction with respect to the curvature and log slope evaluated using test pattern B.
Figure 13:
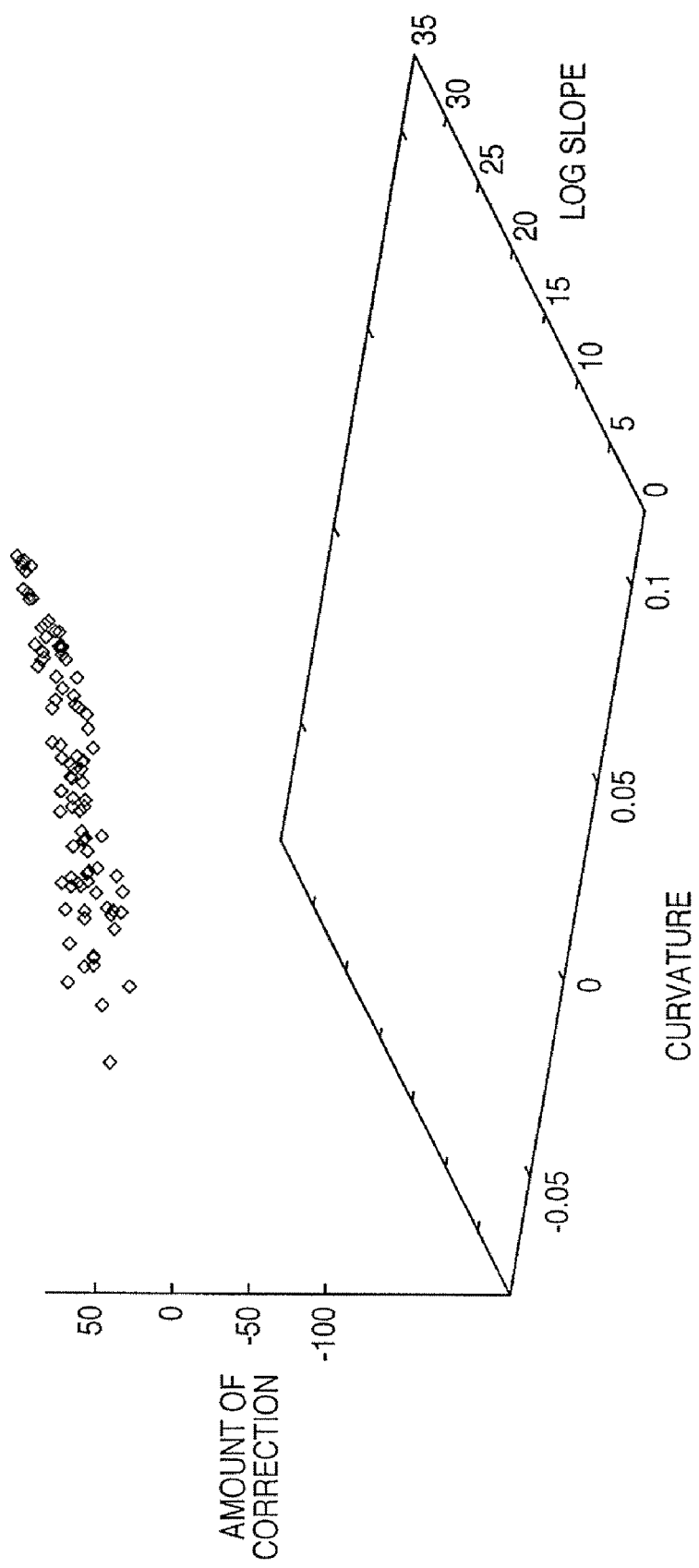
FIG. 13 is a graph showing plots of the amount of correction with respect to the curvature and log slope evaluated using test pattern C.
Figure 14:
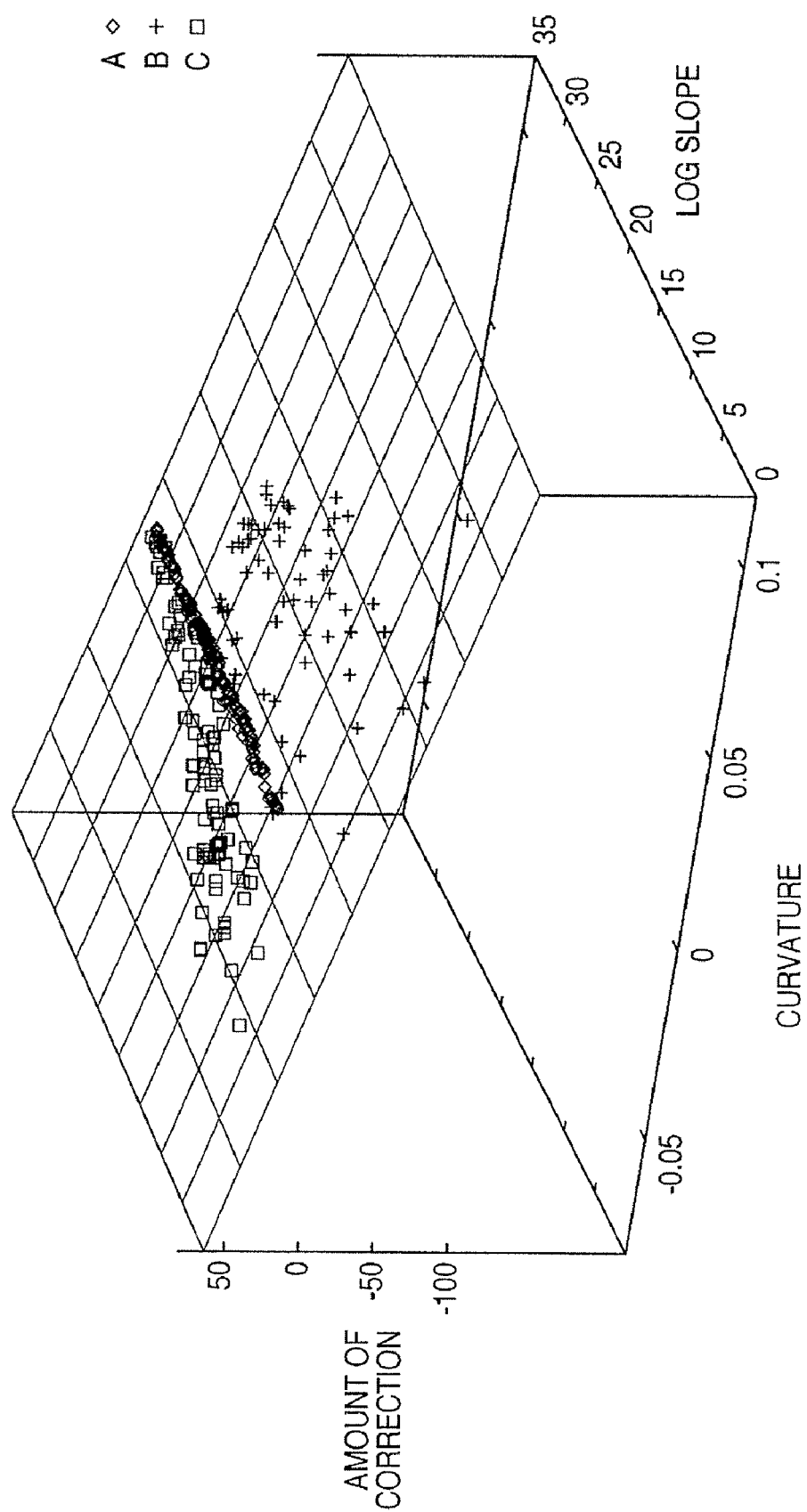
FIG. 14 is a graph showing an approximate regression plane function obtained by plotting all the results of the evaluation using test patterns A, B, and C.
Figure 15:
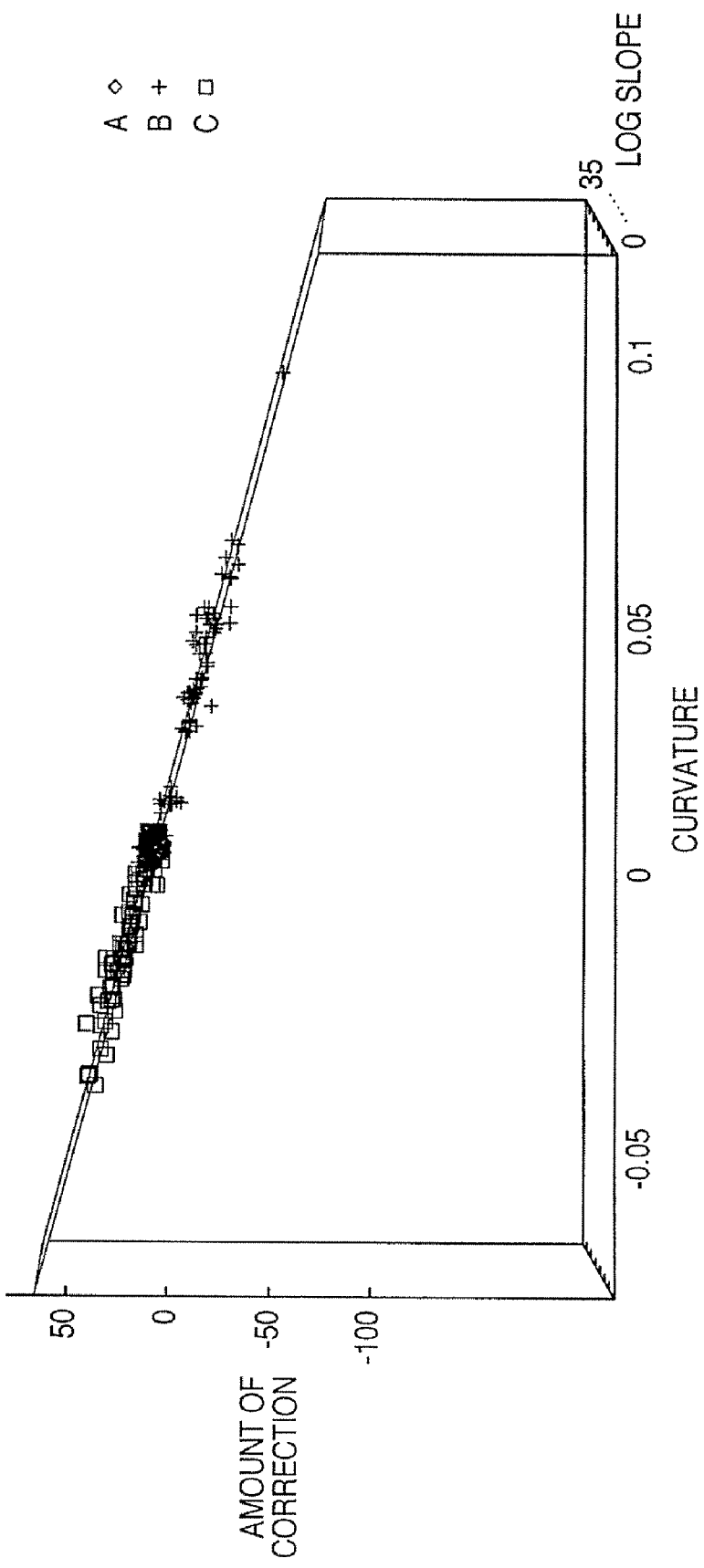
FIG. 15 is a graph showing the approximate regression plane function obtained by plotting all the results of the evaluation using test patterns A, B, and C.

FIG. 11 shows plots of the amount of correction with respect to combinations of various curvatures and log slopes in pattern A shown in FIG. 8. Similarly, FIGS. 12 and 13 show plots of the amounts of correction in patterns B and C shown in FIGS. 9 and 10, respectively. FIGS. 14 and 15 show a regression plane function (regression function) obtained by simultaneously plotting these amounts of correction. This regression plane function serves as a correction model. The plane function is simple enough to sufficiently shorten the time taken to compute the resist pattern shape from the optical contour shape based on the correction model in the processes shown in FIG. 1.

The fitting of a correction model can use, for example, a least square method. The fitting accuracy of the least square method is as high as, for example, about 2 nm in RMS (Root Mean Square; also called mean square deviation). In addition, since this fitting accuracy reduces influences of errors (e.g., condition setting differences and measurement errors) of individual data, the prediction accuracy of a resist pattern correction model is relatively high.

As described above, the correction model is described by a plane function which attains high speed and high accuracy.

Figure 16:
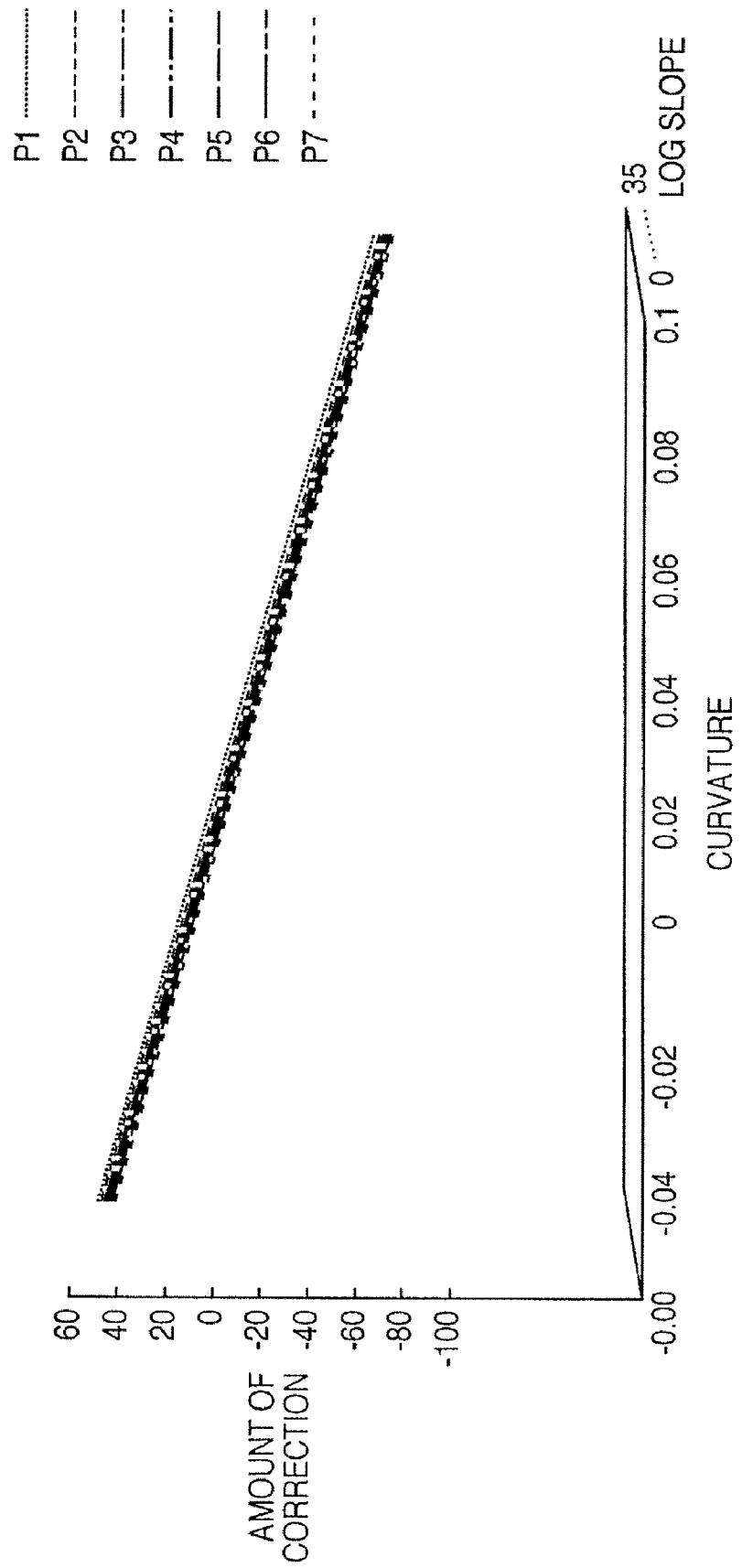
FIG. 16 is a graph showing the relationship between a correction model and the numerical aperture and shape of illumination.

FIG. 16 shows the result of simultaneously plotting the regression plane functions (regression functions) of correction models created by changing the numerical aperture and shape of illumination. The numerical aperture and shape of illumination have seven types P1 to P7. The numerical aperture is changed in the range of 0.81 to 0.85. A ring-like illumination shape is changed such that the ratio of change for its inner shape ranges from 0.47 to 0.62 while that for its outer shape ranges from 0.85 to 0.93. The regression plane functions (regression functions) of the seven types of correction models densely overlap each other. That is, in this correction model, the computation accuracy is less likely to change in response to a change in the illumination condition of the projection exposure apparatus. This means that a correction model created under one condition is also applicable to other illumination conditions.

The resist shape can be predicted with high speed and high accuracy by the above-described resist pattern shape prediction method and correction model. This makes it possible to predict the shape of a resist pattern formed based on even a relatively large-scale reticle pattern.

Using a resist pattern shape prediction method according to a preferred embodiment of the present invention makes it possible to predict the exposure result with high speed and high accuracy without any actual exposure or development as long as a correction model is created for a used resist process.

Using a resist pattern shape prediction method according to a preferred embodiment of the present invention also makes it possible to generate a reticle pattern which can attain a target resist pattern shape. For example, the resist pattern shape is predicted using a target resist pattern as a reticle pattern. If a resist pattern shape different from the target one is predicted, the reticle pattern is changed so as to change the light intensity of a different resist pattern portion. The resist pattern shape is predicted for this changed reticle pattern. This operation is repeated until the target resist pattern shape is obtained.

A resist pattern shape prediction method according to a preferred embodiment of the present invention can search for an illumination condition to simultaneously obtain a plurality of target resist pattern shapes using a plurality of patterns formed on a reticle. For example, under a plurality of illumination conditions under which different shapes and numerical apertures of illumination are set, a change in the resist pattern shape in response to changes in the amount of exposure and the depth of focus is predicted for each pattern formed on the reticle. Based on this prediction result, an exposure margin and a depth of focus which meet requirements of a target resist pattern shape are computed for each pattern formed on the reticle. The ranges of the exposure margin and the depth of focus common to the reticle patterns are evaluated for each illumination condition. This makes it possible to search for an illumination condition to simultaneously obtain a plurality of target resist pattern shapes using a plurality of patterns formed on the reticle.

It is also possible to combine the above-described reticle pattern generation method and illumination condition search.

Second Embodiment

In the second embodiment of the present invention, the resist pattern shape is predicted by referring to variable parameters of a projection exposure apparatus, such as aberration, illumination, and polarization, to determine parameter contents with which a target resist pattern shape is obtained. The projection exposure apparatus is controlled in accordance with the determined contents. A series of these processes are executed automatically.

Figure 18:
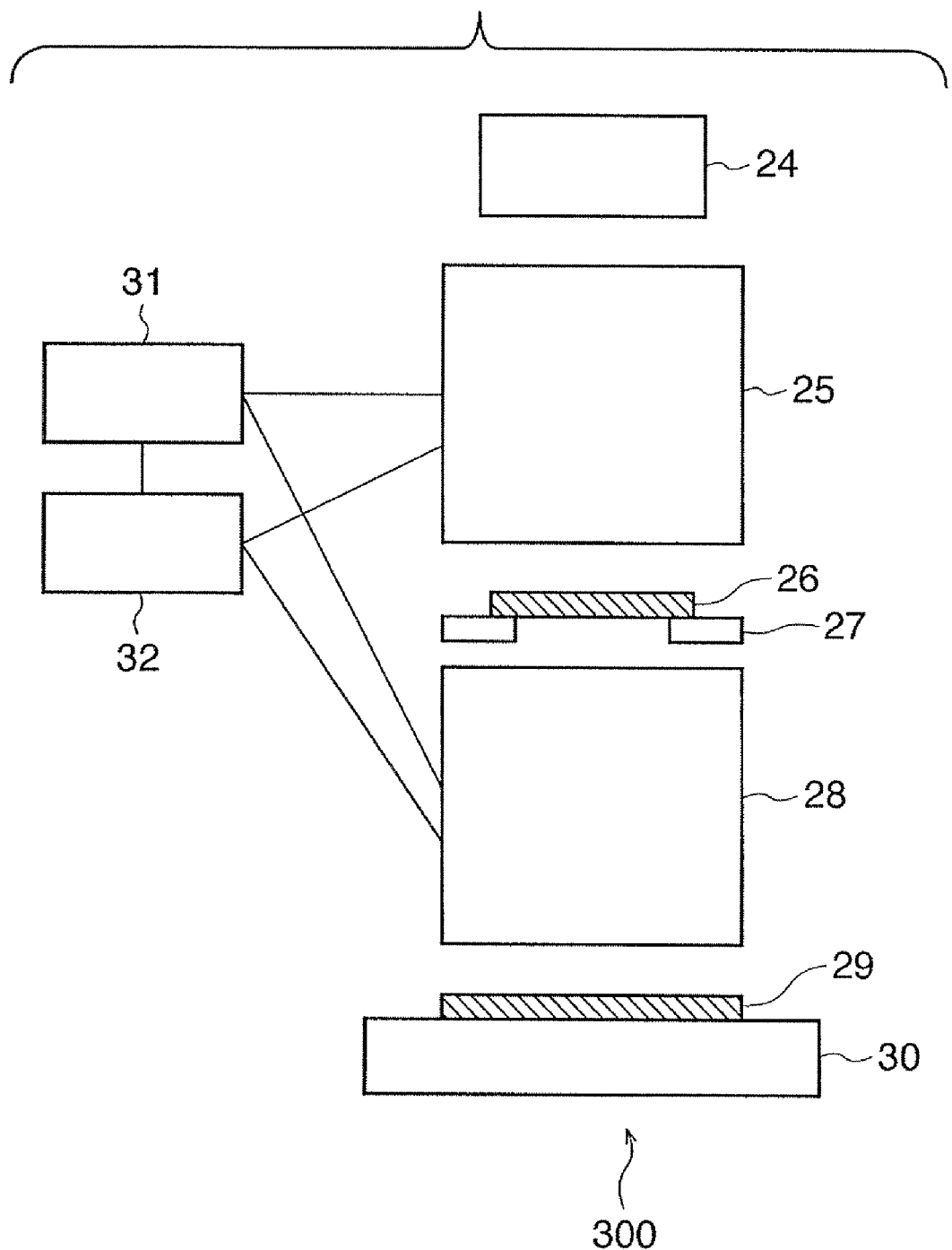
FIG. 18 is a view showing another arrangement of the projection exposure apparatus.

FIG. 18 is a view showing an arrangement of a projection exposure apparatus according to the second embodiment. A parameter determination simulator 31 includes the function of the resist simulator according to the first embodiment. While predicting the resist pattern shape using this function, the parameter determination simulator 31 determines the parameter contents of a projection exposure apparatus 300 such that it forms a resist pattern with a target shape. The parameter determination simulator 31 sends the determined parameter contents to a controller 32. The controller 32 operates the projection exposure apparatus 300 in accordance with the sent parameter contents. The parameters of the projection exposure apparatus 300 can be, for example, the numerical aperture, coherence factor σ, aberration, and polarization.

Figure 19:
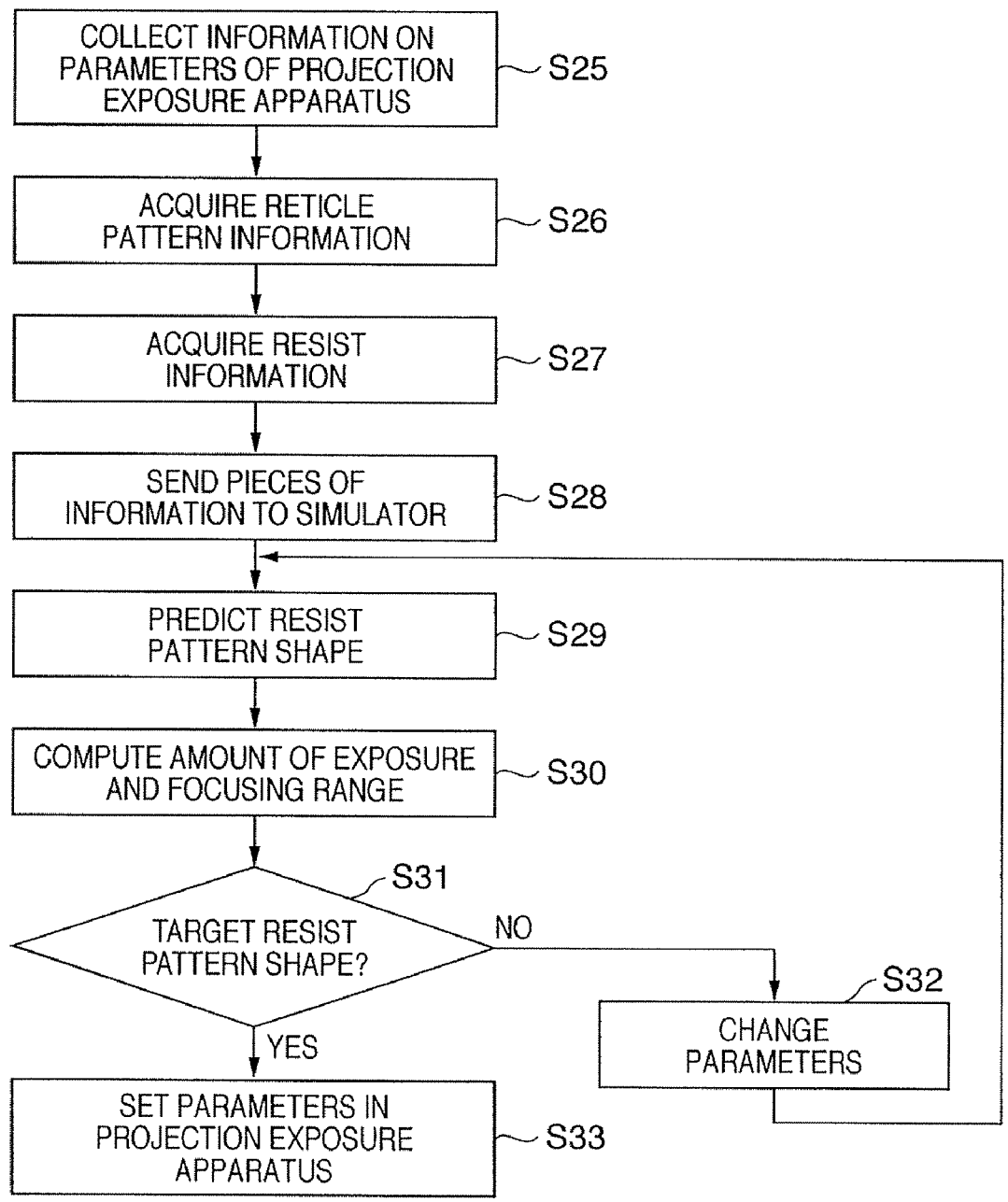
FIG. 19 is a flowchart illustrating the operation of a projection exposure apparatus according to the second embodiment.

FIG. 19 is a flowchart illustrating the operation of the projection exposure apparatus according to the second embodiment. In step S25, the controller 32 collects information on variable parameters of the projection exposure apparatus 300. In step S26, the controller 32 acquires reticle pattern information. In step S27, the controller 32 acquires resist information. The resist information can include, for example, a correction model, reference pattern, and optical slice level.

In step S28, the controller 32 sends the pieces of information acquired in steps S25 to S27 to the parameter determination simulator 31.

In step S29, based on the pieces of information sent from the controller 32, the parameter determination simulator 31 predicts the resist pattern shape by referring to the parameter contents of the projection exposure apparatus 300 at the present time. In step S30, the parameter determination simulator 31 computes an optimal amount of exposure and focusing range. In step S31, the parameter determination simulator 31 determines whether a target resist pattern shape is obtained when the projection exposure apparatus 100 is controlled to execute exposure in accordance with the parameter contents at the present time.

If the parameter determination simulator 31 determines in step S31 that the target resist pattern shape is not obtained, in step S32 it changes the values of the parameters of the projection exposure apparatus 100. After that, the processes in steps S29 to S31 are repeated.

If the parameter determination simulator 31 determines in step S31 that the target resist pattern shape is obtained, in step S33 the controller 32 sets the parameter contents, with which the target resist pattern is determined to be obtained, in the projection exposure apparatus 300.

APPLICATION EXAMPLE

Figure 21:
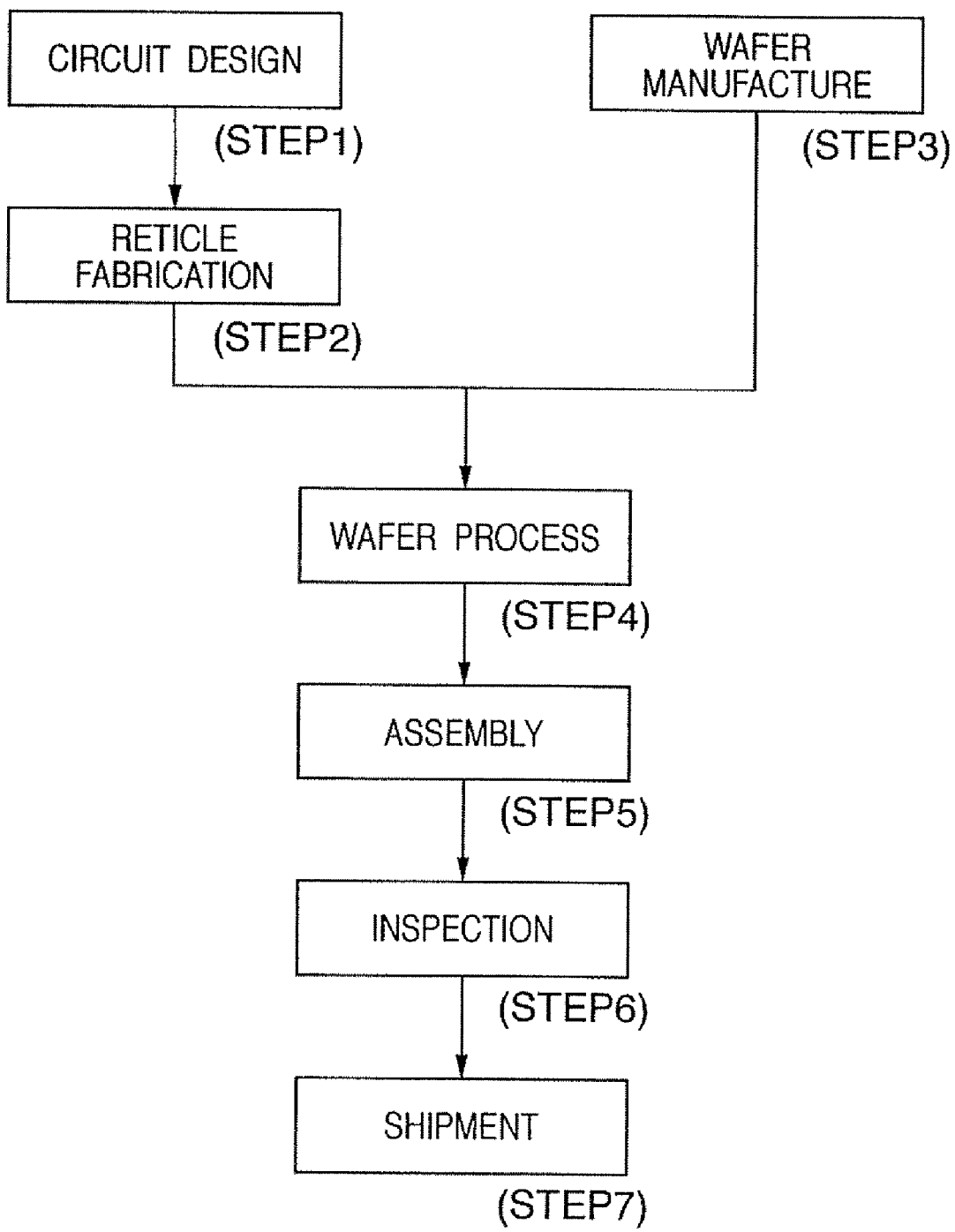
FIG. 21 is a flowchart illustrating the sequence of the overall semiconductor device manufacturing process.

A device manufacturing method using a projection exposure apparatus having a simulator, as represented by the above-described projection exposure apparatus 100 or 300, will be explained next. FIG. 21 is a flowchart illustrating the sequence of the overall semiconductor device manufacturing process. In step 1 (circuit design), the circuit of a semiconductor device is designed. In step 2 (reticle fabrication), a reticle (also called an original or mask) is fabricated based on the designed circuit pattern. In step 3 (wafer manufacture), a wafer (also called a substrate) is manufactured using a material such as silicon. In step 4 (wafer process) called a preprocess, an actual circuit is formed on the wafer by lithography using the reticle and wafer. In step 5 (assembly) called a post-process, a semiconductor chip is formed using the wafer manufactured in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped in step 7.

Figure 22:
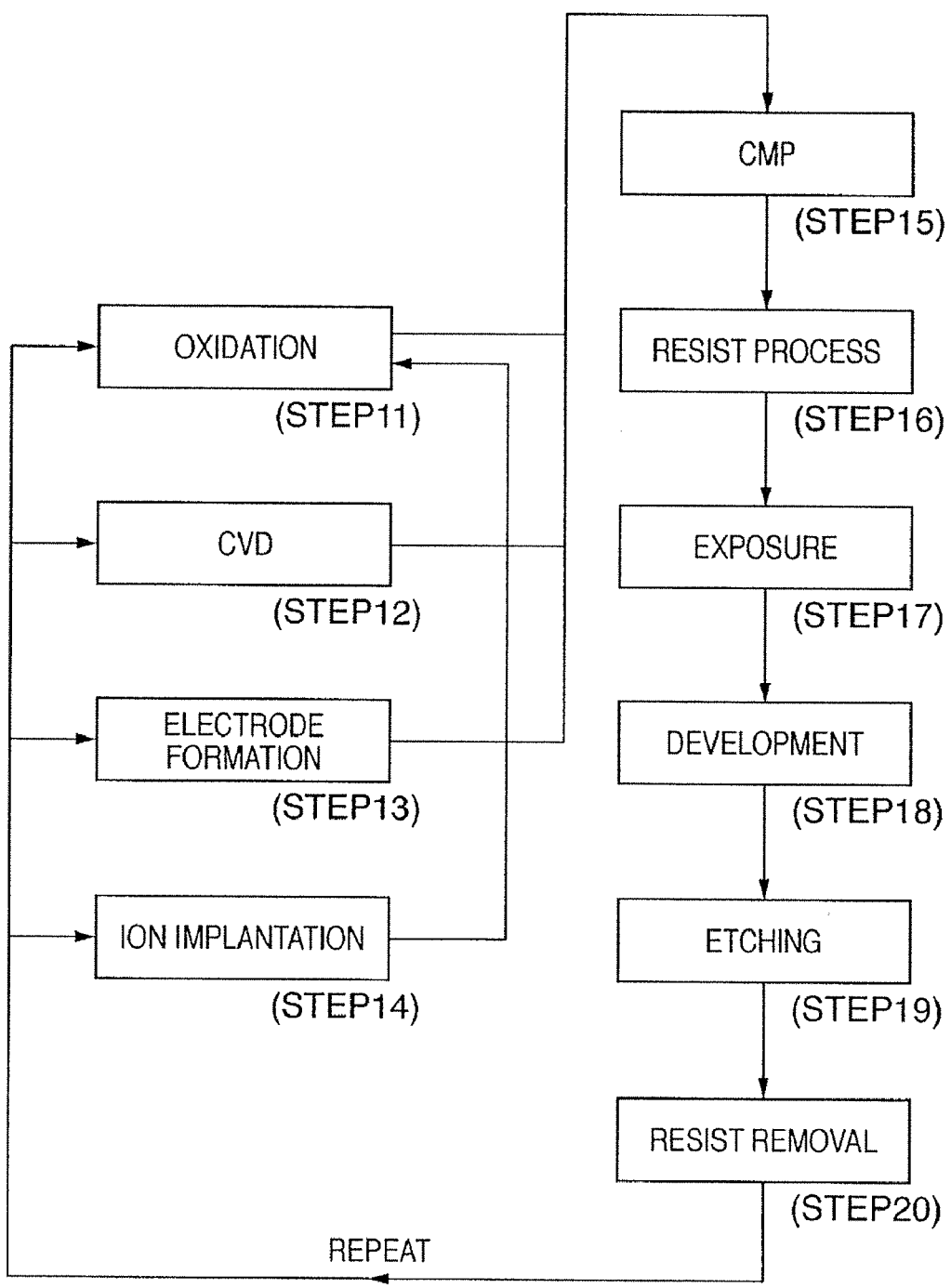
FIG. 22 is a flowchart illustrating the detailed sequence of the wafer process.

FIG. 22 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted into the wafer. In step 15 (CMP), the insulating film is planarized by CMP. In step 16 (resist process), a photosensitive agent is applied on the wafer. In step 17 (exposure), the above-described exposure apparatus is used to form a latent image pattern on the resist by exposing the wafer coated with the photosensitive agent to light via the mask on which the circuit pattern is formed. In step 18 (development), the latent image pattern formed on the resist on the wafer is developed to form a resist pattern. In step 19 (etching), the layer or substrate under the resist pattern is etched through an opening of the resist pattern. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-047885, filed Feb. 27, 2007, which is hereby incorporated by reference herein in its entirety.

What is claimed is:

1. A method of predicting a shape of a resist pattern formed by an exposure process of projecting light from a reticle pattern onto a resist via a projection optical system to expose the resist, and a development process of developing the resist, the method comprising:
   computing, by a computer, a first contour shape of an aerial image formed on the resist by projecting light from a test pattern serving as the reticle pattern onto the resist via the projection optical system, when the test pattern is arranged on an object plane of the projection optical system, to produce the first contour shape;
   measuring, by a measurement apparatus, a shape of a resist pattern formed by the exposure process using the test pattern and the development process;
   creating, by the computer, a correction model including a function indicating a relationship between at least one of amounts of geometric characteristic of the first contour shape and an amount of correction determined in accordance with a difference between the first contour shape and the measured shape of the resist pattern;
   computing, by the computer, a second contour shape of an aerial image formed on the resist by projecting light from an arbitrary pattern onto the resist via the projection optical system, when the arbitrary pattern is arranged on the object plane, to produce the second contour shape; and
   predicting, by the computer, the shape of the resist pattern corresponding to the arbitrary pattern by correcting the second contour shape, using an amount of correction given by the correction model in correspondence with at least one of amounts of geometric characteristic of the second contour shape.

2. The method according to claim 1, wherein the amounts of geometric characteristic of the contour shape includes a curvature at a contour point of the contour shape.

3. The method according to claim 1, wherein the function includes a linear function of a curvature at a contour point of the contour shape and a log slope of the aerial image at the contour point.

4. The method according to claim 1, wherein the amounts of geometric characteristic of the contour shape includes a log slope.

5. A method of predicting a shape of a resist pattern formed by an exposure process of projecting light from a reticle pattern onto a resist via a projection optical system to expose the resist, and a development process of developing the resist, the method comprising:
   computing a first contour shape of an aerial image formed on the resist by projecting light from a test pattern serving as the reticle pattern onto the resist via the projection optical system, when the test pattern is arranged on an object plane of the projection optical system, to produce the first contour shape;
   acquiring a result of measuring a shape of a resist pattern formed by the exposure process using the test pattern and the development process;
   creating a correction model including a function indicating a relationship between at least one of amounts of geometric characteristic of the first contour shape and an amount of correction determined in accordance with a difference between the first contour shape and the acquired shape of the resist pattern;

computing a second contour shape of an aerial image formed on the resist by projecting light from an arbitrary pattern onto the resist via the projection optical system when the arbitrary pattern is arranged on the object plane, to produce the second contour shape; and predicting the shape of the resist pattern corresponding to the arbitrary pattern by correcting the second contour shape, using an amount of correction given by the correction model in correspondence with at least one of amounts of geometric characteristic of the second contour shape using a computer.

6. A non-transitory readable storage medium storing a program for causing a computer to execute a process of predicting a shape of a resist pattern formed by an exposure process of projecting light from a reticle pattern onto a resist via a projection optical system to expose the resist, and a development process of developing the resist, the program causing the computer to execute:

computing a first contour shape of an aerial image formed on the resist by projecting light from a test pattern serving as the reticle pattern onto the resist via the projection optical system, when the test pattern is arranged on an object plane of the projection optical system, to produce the first contour shape;

acquiring a result of measuring a shape of a resist pattern formed by the exposure process using the test pattern and the development process;

creating a correction model including a function indicating a relationship between at least one of amounts of geometrica characteristic of the first contour shape and an amount of correction determined in accordance with a difference between the first contour shape and the acquired shape of the resist pattern;

computing a second contour shape of an aerial image formed on the resist by projecting light from an arbitrary pattern onto the resist via the projection optical system, when the arbitrary pattern is arranged on the object plane, to produce the second contour shape; and predicting the shape of the resist pattern corresponding to the arbitrary pattern by correcting the second contour shape, using an amount of correction given by the correction model in correspondence with at least one of amounts of geometric characteristic of the second contour shape.

7. A computer which predicts a shape of a resist pattern formed by an exposure process of projecting light from a reticle pattern onto a resist via a projection optical system to expose the resist, and a development process of developing the resist, said computer comprising:

a first computation unit configured to compute a first contour shape of an aerial image formed on the resist by projecting light from a test pattern serving as the reticle pattern onto the resist via the projection optical system, when the test pattern is arranged on an object plane of the projection optical system, to produce the first computed contour shape;

an acquisition unit configured to acquire a result of measuring a shape of a resist pattern formed by the exposure process using the test pattern and the development process;

a creation unit configured to create a correction model including a function indicating a relationship between at least one of amounts of geometric characteristic of the contour shape and an amount of correction determined in accordance with a difference between the first contour shape and the acquired shape of the resist pattern;

a second computation unit configured to compute a second contour shape of an aerial image formed on the resist by projecting light from an arbitrary pattern onto the resist via the projection optical system when the arbitrary pattern is arranged on the object plane, to produce the second contour shape; and a prediction unit configured to predict the shape of the resist pattern corresponding to the arbitrary pattern by correcting the second contour shape, using an amount of correction given by the correction model in correspondence with at least one of amounts of geometric characteristic of the second contour shape of the aerial image.

8. A projection exposure apparatus which projects light from a reticle pattern onto a resist via a projection optical system and exposes the resist, said apparatus comprising the computer defined in claim 7.

9. A method for manufacturing a device, the method comprising:

an exposure step of exposing a resist on a substrate using a projection exposure apparatus defined in claim 8; and a development step of developing the resist.

10. A method of predicting a shape of a resist pattern formed by an exposure process of projecting light from a reticle pattern onto a resist via a projection optical system to expose the resist, and a development process of developing the resist, the method, by performing following steps by a computer, comprising:

creating a correction model including a function indicating a relationship between at least one of amounts of geometric characteristic of a first contour shape of an aerial image formed on the resist by projecting light from a test pattern serving as the reticle pattern onto the resist via the projection optical system and an amount of correction determined in accordance with a difference between the first contour shape and a shape of a resist pattern formed by exposure process using the test pattern and development process;

computing a second contour shape of an aerial image formed on the resist by projecting light from an arbitrary pattern onto the resist via the projection optical system; and predicting the shape of the resist pattern corresponding to the arbitrary pattern by correcting the second contour shape, using an amount of correction given by the correction model and at least one of amounts of geometric characteristic of the second contour shape.

\* \* \* \* \*